(12) United States Patent
Kobayashi

(10) Patent No.: US 9,070,776 B2
(45) Date of Patent: Jun. 30, 2015

(54) SEMICONDUCTOR DEVICE AND DRIVING METHOD THEREOF

(75) Inventor: Hidetomo Kobayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 624 days.

(21) Appl. No.: 13/442,995

(22) Filed: Apr. 10, 2012

(65) Prior Publication Data

US 2012/0262983 A1  Oct. 18, 2012

(30) Foreign Application Priority Data

Apr. 15, 2011 (JP) ................................. 2011-091577
May 14, 2011 (JP) ................................. 2011-108882

(51) Int. Cl.
*G11C 5/14* (2006.01)
*H01L 29/786* (2006.01)
*H01L 27/12* (2006.01)

(52) U.S. Cl.
CPC ........ *H01L 29/7869* (2013.01); *H01L 27/1225* (2013.01)

(58) Field of Classification Search
CPC ........... G11C 5/14; G11C 5/147; G11C 5/148
USPC .............. 365/226, 227, 228, 189.09
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Han Yang

(74) *Attorney, Agent, or Firm* — Fish & Richardson P.C.

(57) ABSTRACT

The circuit includes a first wiring for supplying a power supply potential to a signal processing circuit, a transistor for controlling electrical connection between the first wiring and a second wiring for supplying the a power supply potential, and a transistor for determining whether or not the first wiring is grounded. At least one of the two transistors is a transistor whose channel is formed in the oxide semiconductor layer. This makes it possible to reduce power consumption due to cutoff current of at least one of the two transistors.

13 Claims, 23 Drawing Sheets

(56) References Cited

U.S. PATENT DOCUMENTS

| | | | |
|---|---|---|---|
| 7,323,356 B2 | 1/2008 | Hosono et al. | |
| 7,339,411 B2 * | 3/2008 | Yuuki et al. | 327/198 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,687,808 B2 | 3/2010 | Umezaki | |
| 7,732,819 B2 | 6/2010 | Akimoto et al. | |
| 7,859,510 B2 | 12/2010 | Umezaki | |
| 7,964,876 B2 | 6/2011 | Umezaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0167026 A1 | 11/2002 | Azami et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0140839 A1 | 7/2004 | Nagao et al. | |
| 2005/0017302 A1 | 1/2005 | Hoffman | |
| 2005/0062515 A1 | 3/2005 | Nagao et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0202940 A1 | 9/2006 | Azami et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0280279 A1 | 12/2006 | Nagao et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0121998 A1 | 5/2009 | Ohkawa et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0084960 A1 | 4/2011 | Miyake et al. | |
| 2011/0187694 A1 | 8/2011 | Umezaki | |
| 2011/0227066 A1 | 9/2011 | Umezaki | |
| 2014/0293711 A1 * | 10/2014 | Kato et al. | 365/189.05 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2001-035180 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |
| WO | 2007/080813 A1 | 7/2007 |
| WO | 2007/108177 A1 | 9/2007 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol—Gel—Derived Zinc Oxide Films by Irradiation With Ultraviolet Lamp," Journal of Sol—Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,$YBFE_2O_4$, and $YB_2FE_3O_7$ Types of Structures for Compounds in the $In_2O_3$ and $SC_2O_3$—$A_2O_3$—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, $In_2O_3(ZnO)m$ (m = 3, 4, and 5), $InGaO_3(ZnO)3$,

(56) References Cited

OTHER PUBLICATIONS and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

FIG. 8A   FIG. 8B
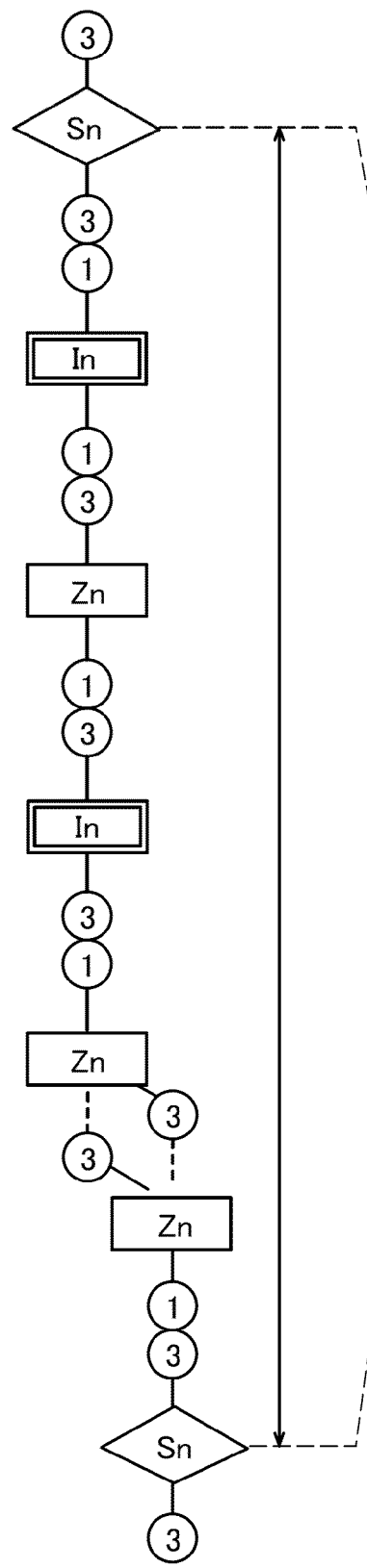
FIG. 8C
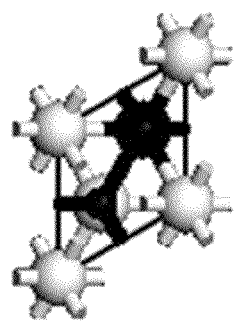
● In
☾ Sn
c Zn
• O

● In

○ Ga

○ Zn

● O

SEMICONDUCTOR DEVICE AND DRIVING METHOD THEREOF

BACKGROUND OF THE INVENTION

1. Field of the Invention

The present invention relates to semiconductor devices. In particular, the present invention relates to a semiconductor device in which supply of power supply voltage to a signal processing circuit can be stopped. Note that in this specification, semiconductor devices mean all devices formed using semiconductors.

2. Description of the Related Art

A signal processing circuit such as a central processing unit (CPU) has a variety of configurations depending on its application but is generally provided with some kinds of storage devices such as a register and a cache memory as well as a main memory for storing data or a program. A register has a function of temporarily holding data for carrying out arithmetic processing, holding a program execution state, or the like. In addition, a cache memory is located between an arithmetic circuit and a main memory in order to reduce low-speed access to the main memory and speed up the arithmetic processing.

In a storage device such as a register or a cache memory, writing of data needs to be performed at higher speed than in a main memory. For this reason, in general, a flip-flop circuit or the like is used as a register, and a static random access memory (SRAM) or the like is used as a cache memory. That is, a volatile storage device in which data is erased when supply of power supply potential is stopped is used for such a register, a cache memory, or the like.

In order to reduce power consumption, a method for temporarily stopping supply of a power-supply voltage to a signal processing circuit in a period during which data is not input and output has been suggested. In the method, a nonvolatile storage device is located in the periphery of a volatile storage device such as a register or a cache memory, so that the data is temporarily stored in the nonvolatile storage device. Thus, data stored in the register, the cache memory, or the like can be held even while supply of power supply potential is stopped in the signal processing circuit (for example, see Patent Document 1).

In addition, in the case where supply of the power-supply voltage is stopped for a long time in a signal processing circuit, data in a volatile storage device is transferred to an external storage device such as a hard disk or a flash memory before the supply of the power-supply voltage is stopped, so that the data can be prevented from being erased.

REFERENCE

[Patent Document 1] Japanese Published Patent Application No. H10-078836

SUMMARY OF THE INVENTION

In order to stop supply of power supply voltage to a signal processing circuit, a circuit (a power supply control circuit) which functions as a switch for determining whether or not the power supply voltage is supplied is needed. An object of one embodiment of the present invention is to provide a circuit preferable for the circuit.

A semiconductor device of one embodiment of the present invention is to form a power supply control circuit by using a transistor whose channel is formed in an oxide semiconductor layer. Here, an oxide semiconductor has a wide band gap and a low intrinsic carrier density. Accordingly, a cutoff current generated in the oxide semiconductor layer can be extremely low. The features are unique to an oxide semiconductor, that is, other kinds of semiconductors (e.g., silicon) do not have such features.

Specifically, the semiconductor device of one embodiment of the present invention includes a first wiring for supplying a power supply potential to the signal processing circuit, a transistor for controlling electrical connection between the first wiring and a second wiring for supplying a power supply potential, and a transistor for determining whether or not the first wiring is grounded. Further, the semiconductor device of one embodiment of the present invention meets the following two conditions: at least one of the two transistors has a channel formed in an oxide semiconductor layer (Condition 1); and switching of the former transistor is controlled by an interrupt signal input from an outside circuit, and the switching of the latter transistor is controlled by a power supply stopping signal input from the signal processing circuit (Condition 2).

Note that in this specification, an interrupt signal indicates a signal which is output from an input device (e.g., a keyboard) or a detector (e.g., a sensor such as a photosensor or a temperature sensor) provided together with the semiconductor device and which requests the semiconductor device to perform operations.

In the semiconductor device, a power supply potential can be supplied to the first wiring for supplying the power supply potential to the signal processing circuit when the former transistor is on and the latter transistor is off. In addition, supply of the power supply potential to the signal processing circuit can be stopped when the former transistor is off and the latter transistor is on.

Here, according to Condition 1, it is possible to reduce at least one of the following power consumptions: a power consumption due to cutoff current of the latter transistor in a period during which the power supply potential is supplied to the first wiring for supplying the power supply potential to the signal processing circuit, and a power consumption due to cutoff current of the former transistor in a period during which supply of the power supply potential to the first wiring for supplying the power supply potential to the signal processing circuit is stopped.

Further, according to Condition 2, a circuit is not needed to which the power supply potential is constantly supplied for resuming supply of the power supply potential to the first wiring for supplying the power supply potential to the signal processing circuit. That is, power consumption of the semiconductor device can be further reduced.

BRIEF DESCRIPTION OF THE DRAWINGS

FIG. 1C shows an example of change over time in an input/output signal of the power supply control circuit and the like.

FIG. 2B shows an example of change over time in an input/output signal of the power supply control circuit and the like.

FIG. 3B shows an example of change over time in an input/output signal of the power supply control circuit and the like.

FIGS. 8A to 8C each illustrate an example of a crystal structure included in CAAC.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.
<Configuration Example of Semiconductor Device>

Figure 1A:
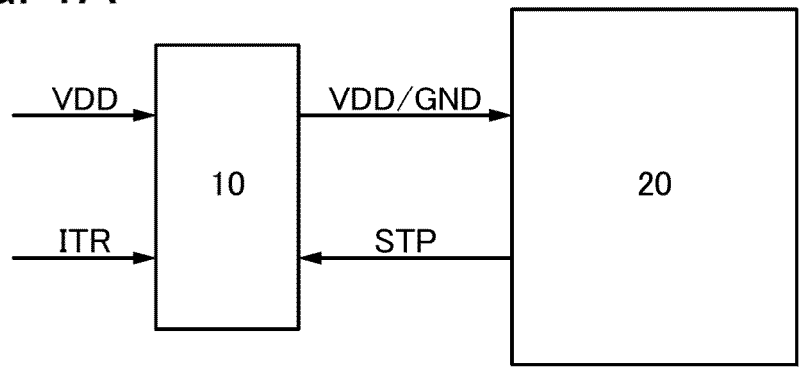
FIG. 1A illustrates a configuration example of a semiconductor device.

FIG. 1A is a block diagram illustrating a structural example of a semiconductor device according to one embodiment of the present invention. The semiconductor device illustrated in FIG. 1A includes a power supply control circuit 10 and a signal processing circuit 20. A power supply potential (VDD) and an interrupt signal (ITR) are input to the power supply control circuit 10. The power supply potential (VDD) or a ground potential (GND) is supplied from the power supply control circuit 10 to the signal processing circuit 20. The signal processing circuit 20 outputs a power supply stopping signal (STP) to the power supply control circuit 10. Note that the power supply control circuit 10 determines whether or not the power supply potential (VDD) is supplied to the signal processing circuit 20 (i.e., the power supply control circuit 10 determines which of the power supply potential (VDD) and the ground potential (GND) is to be supplied). Further, the signal processing circuit 20 operates using the power supply potential (VDD) supplied through the power supply control circuit 10.

Note that the interrupt signal (ITR) is input from the outside and requests the semiconductor device to perform operations. The power supply stopping signal (STP) is output from the signal processing circuit 20 to request the power supply control circuit 10 to stop supply of the power supply potential (VDD). In the semiconductor device illustrated in FIG. 1A, supply of the power supply potential (VDD) to the signal processing circuit 20 is started or is continued when the interrupt signal (ITR) is input to the power supply control circuit 10. Supply of the power supply potential (VDD) to the signal processing circuit 20 is stopped (the ground potential (GND) is supplied to a wiring for supplying the power supply potential (VDD)) when the power supply stopping signal (STP) is input to the power supply control circuit 10.
<Configuration Example of Power Supply Control Circuit 10>

Figure 1B:
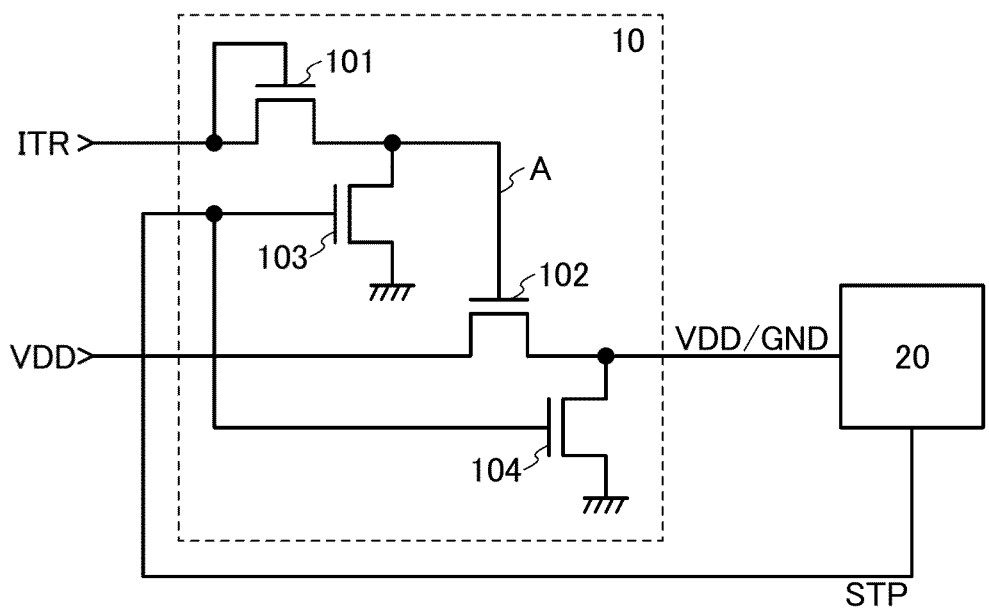
FIG. 1B illustrates a configuration example of a power supply control circuit.

FIG. 1B illustrates a configuration example of the power supply control circuit 10 illustrated in FIG. 1A. The power supply control circuit 10 illustrated in FIG. 1B includes transistors 101 to 104. Connection relation among the transistors 101 to 104 illustrated in FIG. 1B is described below in detail.

A gate of the transistor 101 and one of a source and a drain of the transistor 101 are electrically connected to a wiring for supplying the interrupt signal (ITR) output from the outside.

A gate of the transistor 102 is electrically connected to the other of the source and the drain of the transistor 101. One of a source and a drain of the transistor 102 is electrically connected to the wiring for supplying the power supply potential (VDD). The other of the source and the drain of the transistor 102 is electrically connected to the wiring for supplying the power supply potential (VDD) to the signal processing circuit 20.

A gate of the transistor 103 and a gate of the transistor 104 are electrically connected to a wiring for supplying the power supply stopping signal (STP) output by the signal processing circuit 20.

One of a source and a drain of the transistor 103 is electrically connected to the other of the source and the drain of the transistor 101 and the gate of the transistor 102. The other of the source and the drain of the transistor 103 is grounded.

One of a source and a drain of the transistor 104 is electrically connected to the other of the source and the drain of the transistor 102 and the wiring for supplying the power supply potential (VDD) to the signal processing circuit 20. The other of the source and the drain of the transistor 104 is grounded.
<Operation Example of Power Supply Control Circuit 10>

Figure 1C:
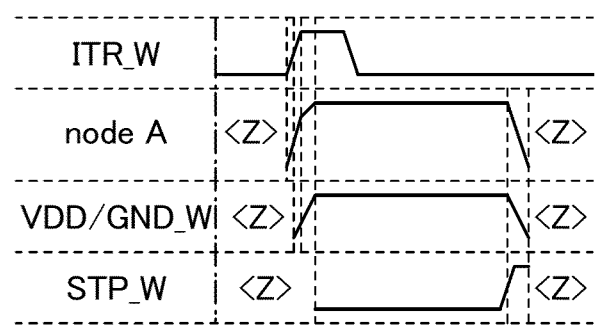

FIG. 1C is a schematic view of change over time in the following potentials: the potential of the wiring (ITR_W) for supplying the interrupt signal (ITR), the potential of a node A of the power supply control circuit 10 illustrated in FIG. 1B, the potential of the wiring (VDD/GND_W) for supplying the power supply potential (VDD) to the signal processing circuit 20 illustrated in FIG. 1B, and the potential of the wiring (STP_W) for supplying the power supply stopping signal (STP). An operation example of the power supply control circuit 10 is described below with reference to FIG. 1C. Note that in the semiconductor device, the power supply potential (VDD) is a fixed potential higher than the ground potential (GND).

When the signal processing circuit 20 is required to perform an operation, the potential of the wiring (ITR_W) is increased to a high-level potential (the interrupt signal (ITR) is supplied). Accordingly, the transistor 101 is turned on and the potential of the node A is increased. When the voltage between the gate and source of the transistor 102 becomes higher than or equal to a threshold voltage by increase in the potential of the node A, the transistor 102 is turned on. Then, the potential of the wiring (VDD/GND_W) is increased. Here, when the potential of the node A is increased to a potential decreased from the high-level potential by a threshold voltage of the transistor 101, the transistor 101 is turned off. Therefore, supply of electric charge through the transistor 101 does not increase the potential of the node A. Note that at this time, the node A is in a floating state. Thus, capacitive coupling of the gate and source of the transistor 102 further increases the potential of the node A (bootstrap). As the result, the potential of the wiring (VDD/GND_W) can be increased to the power supply potential (VDD), exceeding a potential decreased from the power supply potential (VDD) by the threshold voltage of the transistor 102.

In the case where supply of the power supply potential (VDD) to the signal processing circuit 20 is stopped, the potential of the wiring (STP_W) is increased to a high-level potential (the power supply stopping signal (STP) is supplied to the power supply control circuit 10). Accordingly, the potential of the gate of the transistor 103 and the potential of the gate of the transistor 104 are increased. Then, when the gate-source voltage of the transistor 103 and the gate-source voltage of the transistor 104 become higher than or equal to the threshold voltage of the transistor 103 and the threshold voltage of the transistor 104, respectively, the transistor 103 and the transistor 104 are turned on. This makes it possible to ground the node A and the wiring (VDD/GND_W) and decrease the both potential to the ground potential (GND).

Supply of the power supply potential (VDD) to the signal processing circuit 20 is stopped in this manner, whereby power consumption of the semiconductor device can be reduced.

At least one of the transistor 102 and the transistor 104 is a transistor whose channel is formed in an oxide semiconductor layer. This makes it possible to reduce at least one of power consumption due to cutoff current of the transistor 104 in a period in which the power supply potential (VDD) is supplied to the wiring (VDD/GND_W) (the period in which the transistor 102 is on) or power consumption due to cutoff current of the transistor 102 in a period in which supply of the power supply potential (VDD) to the wiring (VDD/GND_W) is stopped (the ground potential (GND) is supplied) (the period in which the transistor 104 is on).

Further, switching of the transistor 102 is controlled by the interrupt signal (ITR) input from the outside, and switching of the transistor 104 is controlled by the power supply stopping signal (STP) input from the signal processing circuit 20. This saves the need for a circuit to which the power supply potential (VDD) is constantly supplied for resuming supply of the power supply potential (VDD) to the wiring (VDD/GND_W). In other words, power consumption of the semiconductor device can be further reduced.

It is preferable to use a transistor whose channel is formed in an oxide semiconductor layer as at least one of the transistor 101 and the transistor 103, leading to a reduction in number of manufacturing steps.

The power supply control circuit 10 illustrated in FIG. 1B may additionally include a capacitor in which one electrode and the other electrode are electrically connected to the gate of the transistor 102 and the wiring (VDD/GND_W), respectively. This makes it possible to perform the forementioned bootstrap with reliability.

<Oxide Semiconductor>

An oxide semiconductor is described below in detail.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide. In the case where an In—Sn—Zn-based oxide is formed by sputtering, an oxide target having a composition ratio of In:Sn:Zn=1:2:2, 2:1:3, 1:1:1, or 20:45:35 in an atomic ratio is used, for example.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. For example, r may be 0.05. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| \, dx \, dy \quad \text{[FORMULA 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

It is preferable for the oxide semiconductor layer to be highly purified (intrinsic or substantially intrinsic) by reduction in impurity such as moisture or hydrogen which serves as an electron donor (donor), because this makes it possible to reduce current generated in a state in which a channel is not formed in the oxide semiconductor layer. Specifically, the concentration of hydrogen in the highly-purified oxide semiconductor layer that is measured by secondary ion mass spectrometry (SIMS) is $5\times10^{19}/cm^3$ or lower, preferably $5\times10^{18}/$ $cm^3$ or lower, more preferably $5\times10^{17}/cm^3$ or lower, still more preferably $1\times10^{16}/cm^3$ or lower. The carrier density of the oxide semiconductor layer measured by Hall effect measurement is less than $1\times10^{14}/cm^3$, preferably less than $1\times10^{12}/cm^3$, further preferably less than $1\times10^{11}/cm^3$.

Here, an analysis on the hydrogen concentration of the oxide semiconductor layer will be mentioned. Note that the hydrogen concentration of a semiconductor layer is measured by secondary ion mass spectrometry. It is known that it is difficult, in principle, to obtain correct data in the proximity of a surface of a sample or in the proximity of an interface between stacked layers formed using different materials by the SIMS analysis. Thus, in the case where the distribution of the concentration of hydrogen in the layer in a thickness direction is analyzed by SIMS, an average value in a region of the layer in which the value is not greatly changed and substantially the same value can be obtained is employed as the hydrogen concentration. Further, in the case where the thickness of the layer is small, a region where almost the same value can be obtained cannot be found in some cases due to the influence of the concentration of hydrogen in the layers adjacent to each other. In that case, the maximum value or the minimum value of the hydrogen concentration in the region of the layer is employed as the hydrogen concentration of the layer. Further, in the case where a mountain-shaped peak having the maximum value or a valley-shaped peak having the minimum value do not exist in the region of the layer, the value at the inflection point is employed as the hydrogen concentration.

In the case where the oxide semiconductor layer is formed by sputtering, it is important to reduce not only hydrogen concentration of a target but also amount of water and hydrogen in a chamber, as much as possible. Specifically, for example, the following countermeasures are effective: inside of the chamber is baked before the deposition; amount of water and hydrogen in a gas introduced in the chamber is reduced; and counter flow of an exhaust system, from which a gas in the chamber is exhausted, is prevented.

The oxide semiconductor layer may be either amorphous or crystalline. For example, as the oxide semiconductor, an oxide including a crystal with c-axis alignment (also referred to as C-Axis Aligned Crystal (CAAC)), which has a triangular or hexagonal atomic arrangement when seen from the direction of an a-b plane, a surface, or an interface may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In CAAC, metal atoms and oxygen atoms are bonded in an orderly manner in comparison with an amorphous oxide semiconductor. That is to say, in the case where an oxide semiconductor is amorphous, the coordination numbers might vary between various metal atoms, but the coordination numbers of metal atoms are almost the same as each other in CAAC. Therefore, microscopic oxygen deficiency is reduced and the instability or movement of charge due to attachment and detachment of hydrogen atoms (including hydrogen ions) or alkali metal atoms is reduced.

Therefore, when the oxide semiconductor layer contains oxide including CAAC, a transistor whose channel is formed in the oxide semiconductor layer can be improved in reliability.

Note that the proportion of oxygen gas in an atmosphere is preferably set high when an oxide semiconductor film including CAAC is deposited by sputtering. For sputtering in a mixed gas atmosphere of argon and oxygen, for example, the proportion of oxygen gas is preferably set 30% or higher, more preferably 40% or higher. This is because supply of oxygen from atmosphere promotes the crystallization of CAAC.

When an oxide film including CAAC is deposited by sputtering, a substrate over which the oxide film including CAAC is deposited is heated preferably to 150° C. or more, more preferably to 170° C. or more. This is because the higher the substrate temperature, the more the crystallization of CAAC is promoted.

After being subjected to heat treatment in a nitrogen atmosphere or in vacuum, the oxide film including CAAC is preferably subjected to heat treatment in an oxygen atmosphere or a gas mixture of oxygen and another gas. This is because oxygen deficiency due to the former heat treatment can be corrected by supply of oxygen from atmosphere in the latter heat treatment.

A film surface on which the oxide film including CAAC (deposition surface) is deposited is preferably flat. This is because irregularity of the deposition surface provides grain boundaries in the oxide film including CAAC because the c-axis approximately perpendicular to the deposition surface exists in the oxide film including CAAC. For this reason, the deposition surface is preferably subjected to planarization such as chemical mechanical polishing (CMP) before the oxide film including CAAC is formed. The average roughness of the deposition surface is preferably 0.5 nm or less, more preferably 0.3 nm or less.

Here, CAAC is described. In a broad sense, CAAC means a non-single crystal including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The oxide film including CAAC is not a single crystal, but this does not mean that the oxide including CAAC is composed of only an amorphous component. In the oxide film including CAAC, a boundary between a crystalline region and an amorphous region is not clear in some cases.

In the case where CAAC includes oxygen, nitrogen may be substituted for part of the oxygen. The c-axes of individual CAAC included in the oxide film including CAAC may be aligned in a certain direction (e.g., a direction perpendicular to a surface of a substrate over which the oxide film including CAAC is formed or a surface of the oxide film including CAAC). Alternatively, the normals of the a-b planes of the individual CAAC included in the oxide film including CAAC may be aligned in a certain direction (e.g., a direction perpendicular to a surface of a substrate over which the oxide film including CAAC is formed or a surface of the oxide film including CAAC).

The oxide film including CAAC becomes a conductor, a semiconductor, or an insulator depending on its composition or the like. In addition, oxide film including CAAC transmits or does not transmit visible light depending on its composition or the like.

An example of such an oxide including CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of CAAC will be described in detail with reference to FIGS. 7A to 7E, FIGS. 8A to 8C, and FIGS. 9A to 9C. In FIGS. 7A to 7E, FIGS. 8A to 8C, and FIGS. 9A to 9C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 7A to 7E, O surrounded by a circle represents a tetracoordinate O atom and O surrounded by a double circle represents a tricoordinate O atom.

Figure 7A:
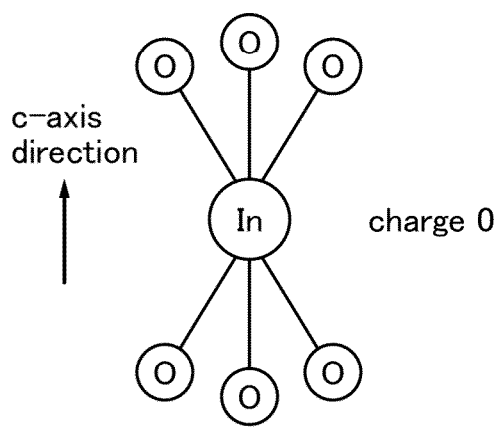
FIGS. 7A to 7E each illustrate an example of a crystal structure included in CAAC.

FIG. 7A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 7A is actually an octahedral structure, but is illustrated as a planar structure for simplicity. Note that three tetracoordinate O atoms exist in each of an upper half and a lower half in FIG. 7A. In the small group illustrated in FIG. 7A, electric charge is 0.

Figure 7D:
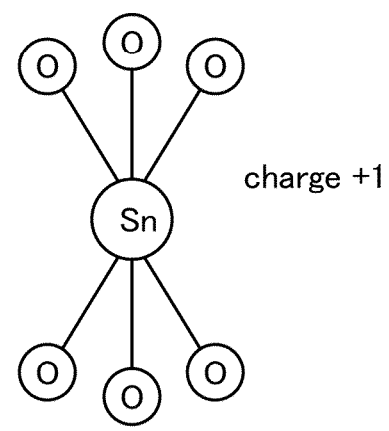
Figure 7B:
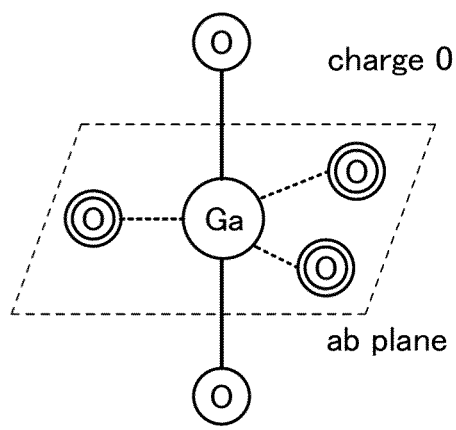

FIG. 7B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 7B. An In atom can also have the structure illustrated in FIG. 7B because an In atom can have five ligands. In the small group illustrated in FIG. 7B, electric charge is 0.

Figure 7E:
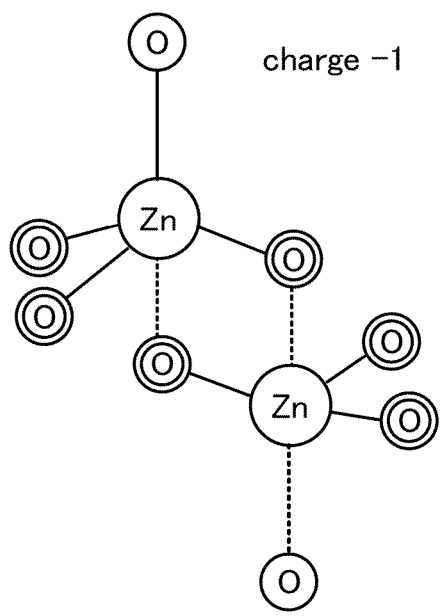
Figure 7C:
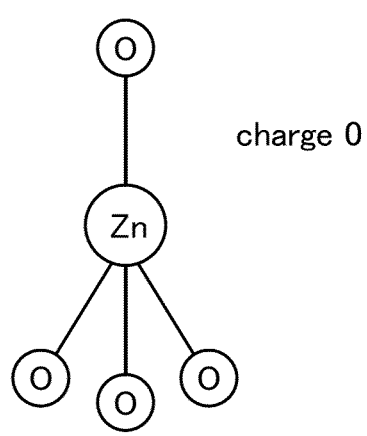

FIG. 7C illustrates a structure including one tetracoordinate Zn atom and four tetracoordinate O atoms proximate to the Zn atom. In FIG. 7C, one tetracoordinate O atom exists in an upper half and three tetracoordinate O atoms exist in a lower half. In the small group illustrated in FIG. 7C, electric charge is 0.

FIG. 7D illustrates a structure including one hexacoordinate Sn atom and six tetracoordinate O atoms proximate to the Sn atom. In FIG. 7D, three tetracoordinate O atoms exist in each of an upper half and a lower half. In the small group illustrated in FIG. 7D, electric charge is +1.

FIG. 7E illustrates a small group including two Zn atoms. In FIG. 7E, one tetracoordinate O atom exists in each of an upper half and a lower half. In the small group illustrated in FIG. 7E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 17A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 8A illustrates a model of a medium group included in a layered structure of an In—Sn—Zn—O-based material. FIG. 8B illustrates a large group including three medium groups. Note that FIG. 8C illustrates an atomic arrangement in the case where the layered structure in FIG. 8B is observed from the c-axis direction.

In FIG. 8A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 8A, one tetracoordinate O atom existing in each of an upper half and a lower half with respect to an In atom is denoted by circled 1. FIG. 8A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 8A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 7E can be given. For example, with one small group including two Zn atoms, electric charge of one small group including a Sn atom can be cancelled, so that the total electric charge of the layered structure can be 0.

When the large group illustrated in FIG. 8B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide, such as an In-based oxide, a Sn-based oxide, or a Zn-based oxide; and the like.

Figure 9A:
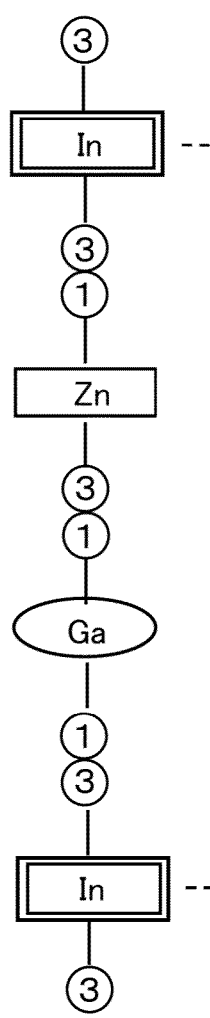
FIGS. 9A to 9C each illustrate an example of a crystal structure included in CAAC.

As an example, FIG. 9A illustrates a model of a medium group included in a layered structure of an In—Ga—Zn—O-based material.

In the medium group included in the layered structure of the In—Ga—Zn—O-based material in FIG. 9A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 9B:
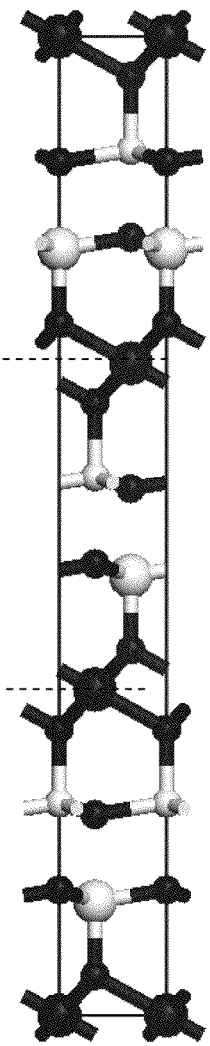
Figure 9C:
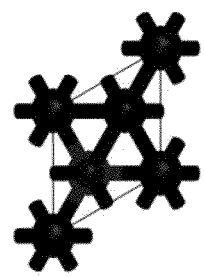

FIG. 9B illustrates a large group including three medium groups. Note that FIG. 9C illustrates an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 9A but also a medium group in which the arrangement of the In atom, the Ga atom, and the Zn atom is different from that in FIG. 9A.

<Transistor Whose Channel is Formed in Oxide Semiconductor Layer>

Next, a transistor whose channel is formed in an oxide semiconductor layer is described with reference to FIGS. 6A to 6D. Note that FIGS. 6A to 6D are schematic cross-sectional views each illustrating an example of the structure of the transistor.

Figure 6A:
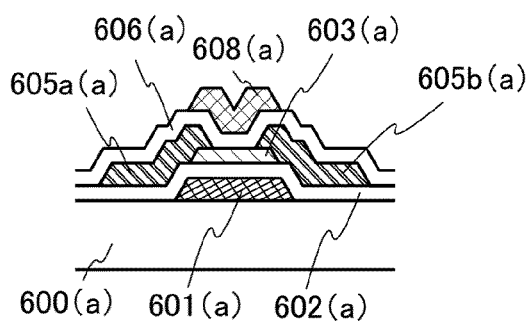
FIGS. 6A to 6D each illustrate a structural example of a transistor.

The transistor illustrated in FIG. 6A includes a conductive layer 601($a$), an insulating layer 602($a$), an oxide semiconductor layer 603($a$), a conductive layer 605$a$(a), a conductive layer 605$b$(a), an insulating layer 606($a$), and a conductive layer 608($a$).

The conductive layer 601($a$) is provided over an element formation layer 600($a$).

The insulating layer 602($a$) is provided over the conductive layer 601($a$).

The oxide semiconductor layer 603($a$) overlaps with the conductive layer 601($a$) with the insulating layer 602($a$) provided therebetween.

The conductive layer 605$a$(a) and the conductive layer 605$b$(a) overlap with the oxide semiconductor layer 603($a$) and are electrically connected to the oxide semiconductor layer 603($a$).

The insulating layer 606($a$) is provided over the oxide semiconductor layer 603($a$), the conductive layer 605$a$(a), and the conductive layer 605$b$(a).

The conductive layer 608($a$) overlaps with the oxide semiconductor layer 603($a$) with the insulating layer 606($a$) provided therebetween.

Note that the conductive layer 601($a$) or the conductive layer 608($a$) is possible not to be provided. When the conductive layer 608($a$) is not provided, the insulating layer 606($a$) is not necessarily provided.

Figure 6C:
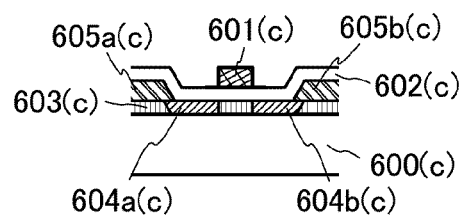
Figure 6B:
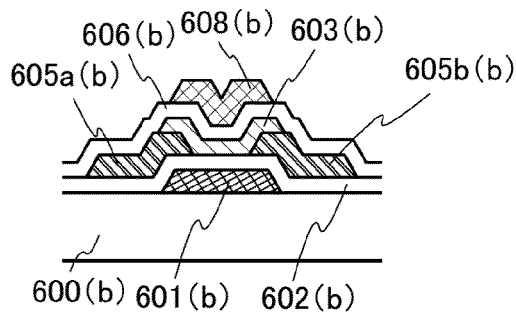

The transistor illustrated in FIG. 6B includes a conductive layer 601($b$), an insulating layer 602($b$), an oxide semiconductor layer 603($b$), a conductive layer 605$a$(b), a conductive layer 605$b$(b), an insulating layer 606($b$), and a conductive layer 608($b$).

The conductive layer 601($b$) is provided over an element formation layer 600($b$).

The insulating layer 602($b$) is provided over the conductive layer 601($b$).

The conductive layer 605$a$(b) and the conductive layer 605$b$(b) are each provided over part of the insulating layer 602($b$).

The oxide semiconductor layer 603($b$) is provided over the conductive layer 605$a$(b) and the conductive layer 605$b$(b) is electrically connected to the conductive layer 605$a$(b) and the conductive layer 605$b$(b). The oxide semiconductor layer 603($b$) overlaps with the conductive layer 601($b$) with the insulating layer 602($b$) provided therebetween.

The insulating layer 606($b$) is provided over the oxide semiconductor layer 603($b$), the conductive layer 605$a$(b), and the conductive layer 605$b$(b).

The conductive layer 608($b$) overlaps with the oxide semiconductor layer 603($b$) with the insulating layer 606($b$) provided therebetween.

Note that the conductive layer 601($b$) or the conductive layer 608($b$) is possible not to be provided. When the conductive layer 608($b$) is not provided, the insulating layer 606($b$) is not necessarily provided.

The transistor illustrated in FIG. 6C includes a conductive layer 601($c$), an insulating layer 602($c$), an oxide semiconductor layer 603($c$), a conductive layer 605$a$(c), and a conductive layer 605$b$(c).

The oxide semiconductor layer 603($c$) includes a region 604$a$(c) and the region 604$b$(c). The region 604$a$(c) and the region 604$b$(c) are provided apart from each other and dopants are imparted thereto. A region between the region 604$a$(c) and the region 604$b$(c) serves as a channel formation region. The oxide semiconductor layer 603($c$) is provided over an element formation layer 600($c$). Note that it is not necessary to provide the region 604$a$(c) and the region 604$b$(c).

The conductive layer 605$a$(c) and the conductive layer 605$b$(c) are provided over and electrically connected to the oxide semiconductor layer 603($c$). The sides of the conductive layer 605$a$(c) and the conductive layer 605$b$(c) are tapered.

The conductive layer 605$a$(c) overlaps with part of the region 604$a$(c); however, this embodiment is not limited thereto. When the conductive layer 605$a$(c) overlaps with part of the region 604$a$(c), resistance between the conductive layer 605$a$(c) and the region 604$a$(c) can be low. An entire region of the oxide semiconductor layer 603($c$) which overlaps with the conductive layer 605$a$(c) may be the region 604$a$(c).

The conductive layer 605$b$(c) overlaps with part of the region 604$b$(c); however, this embodiment is not limited thereto. When the conductive layer 605$b$(c) overlaps with part of the region 604$b$(c), resistance between the conductive layer 605$b$(c) and the region 604$b$(c) can be low. An entire region of the oxide semiconductor layer 603($c$) which overlaps with the conductive layer 605$b$(c) may be the region 604$b$(c).

The insulating layer 602($c$) is provided over the oxide semiconductor layer 603($c$), the conductive layer 605$a$(c), and the conductive layer 605$b$(c).

The conductive layer 601($c$) overlaps with the oxide semiconductor layer 603($c$) with the insulating layer 602($c$) provided therebetween. A region of the oxide semiconductor layer 603($c$) which overlaps with the conductive layer 601($c$) with the insulating layer 602($c$) provided therebetween serves as a channel.

Figure 6D:
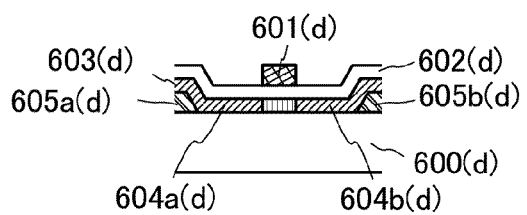

The transistor illustrated in FIG. 6D includes a conductive layer 601($d$), an insulating layer 602($d$), an oxide semiconductor layer 603($d$), a conductive layer 605$a$(d), and a conductive layer 605$b$(d).

The conductive layer 605$a$(d) and the conductive layer 605$b$(d) are provided over an element formation layer 600($d$). The sides of the conductive layer 605$a$(d) and the conductive layer 605$b$(d) are tapered.

The oxide semiconductor layer 603($d$) includes a region 604$a$(d) and a region 604$b$(d). The region 604$a$(d) and the region 604$b$(d) are provided apart from each other and dopants are imparted thereto. A region between the region 604$a$(d) and the region 604$b$(d) serves as a channel. For example, the oxide semiconductor layer 603($d$) is provided over the conductive layer 605$a$(d), the conductive layer 605$b$(d), and the element formation layer 600($d$), and is electrically connected to the conductive layer 605$a$(d) and the conductive layer 605$b$(d). Note that it is not necessary to provide the region 604$a$(d) and the region 604$b$(d).

The region 604$a$(d) is electrically connected to the conductive layer 605$a$(d).

The region 604$b$(d) is electrically connected to the conductive layer 605$b$(d).

The insulating layer 602($d$) is provided over the oxide semiconductor layer 603($d$).

The conductive layer 601($d$) overlaps with the oxide semiconductor layer 603($d$) with the insulating layer 602($d$) provided therebetween. A region of the oxide semiconductor layer 603($d$) which overlaps with the conductive layer 601($d$) with the insulating layer 602($d$) provided therebetween serves as a channel.

Next, the components illustrated in FIGS. 6A to 6D will be described.

The element formation layers 600(a) to 600(d) can be insulating layers, substrates having insulating surfaces, or the like, for example. Further, layers over which elements are formed in advance can be used as the element formation layers 600(a) to 600(d).

The conductive layers 601(a) to 601(d) each function as a gate of the transistor. Note that a layer functioning as a gate of the transistor can be called a gate electrode or a gate wiring.

As the conductive layers 601(a) to 601(d), it is possible to use, for example, a layer of a metal material such as molybdenum, magnesium, titanium, chromium, tantalum, tungsten, aluminum, copper, neodymium, or scandium or an alloy material containing any of these materials as a main component. The conductive layers 601(a) to 601(d) can also be formed by stacking layers of materials which can be applied to the conductive layers 601(a) to 601(d).

The insulating layers 602(a) to 602(d) each function as a gate insulating film of the transistor.

Each of the insulating layers 602(a) to 602(d) can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. The insulating layers 602(a) to 602(d) can also be formed by stacking layers of materials which can be applied to the insulating layers 602(a) to 602(d).

Alternatively, as each of the insulating layers 602(a) to 602(d), an insulating layer of a material containing an element that belongs to Group 13 of the periodic table and oxygen can be used, for example. For example, in the case where the oxide semiconductor layers 603(a) to 603(d) contain an element belonging to Group 13, an insulating layer containing an element belonging to Group 13 is used as an insulating layer which is in contact with the oxide semiconductor layers 603(a) to 603(d), whereby an interface between the insulating layer and the oxide semiconductor layer can have a favorable state.

Examples of the material containing an element that belongs to Group 13 include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. In addition, as the insulating layers 402a to 402c, a material represented by $Al_2O_x$ (x=3+α, where a is larger than 0 and smaller than 1), $Ga_2O_x$ (x=3+α, where a is larger than 0 and smaller than 1), or $Ga_xAl_{2-x}O_{3+a}$ (x is larger than 0 and smaller than 2 and α is larger than 0 and smaller than 1) can be also used.

The insulating layers 602(a) to 602(d) can also be formed by stacking layers of materials which can be applied to the insulating layers 602(a) to 602(d). For example, each of the insulating layers 602(a) to 602(d) can be formed to have a stacked-layer structure of layers containing gallium oxide represented by $Ga_2O_x$. Alternatively, the insulating layers 602(a) to 602(d) may be formed by stacking an insulating layer including gallium oxide represented by $Ga_2O_x$ and an insulating layer including aluminum oxide represented by $Al_2O_x$.

Further, when the channel length of the transistor is 30 nm, each of the thicknesses of the oxide semiconductor layers 603(a) to 603(d) may be about 5 nm. At this time, if each of the oxide semiconductor layers 603(a) to 603(d) is an oxide semiconductor layer including CAAC, a short-channel effect of the transistor can be prevented.

Dopants imparting n-type or p-type conductivity are added to the region 604a(c), the region 604b(c), the region 604a(d), and the region 604b(d), and these regions each function as a source or a drain of the transistor. As the dopants, for example, one or more of elements of Group 13 in the periodic table (e.g., boron), one or more of elements of Group 15 in the periodic table (e.g., one or more of nitrogen, phosphorus, and arsenic), and one or more of rare gas elements (e.g., one or more of helium, argon, and xenon) can be used. A region functioning as a source of a transistor is also referred to as a source region, and a region functioning as a drain of a transistor is also referred to as a drain region. Addition of the dopants to the region 604a(c), the region 604b(c), the region 604a(d), and the region 604b(d) reduces connection resistance with the conductive layers; therefore, the transistor can be downsized.

The conductive layers 605a(a) to 605a(d) and the conductive layers 605b(a) and 605b(d) each function as a source or a drain of the transistor. Note that a layer functioning as a source of the transistor can be called a source electrode or a source wiring, and a layer functioning as a drain of the transistor can be called a drain electrode or a drain wiring.

Each of the conductive layers 605a(a) to 605a(d) and the conductive layers 605b(a) and 605b(d) can be, for example, a layer of a metal material such as aluminum, magnesium, chromium, copper, tantalum, titanium, molybdenum, or tungsten; or an alloy material which contains any of the above metal materials as a main component. For example, each of the conductive layers 605a(a) to 605a(d) and the conductive layers 605b(a) and 605b(d) can be formed using a layer of an alloy material containing copper, magnesium, and aluminum. Each of the conductive layers 605a(a) to 605a(d) and the conductive layers 605b(a) and 605b(d) can be formed to have a stacked-layer structure of layers that can be used for the conductive layers 605a(a) to 605a(d) and the conductive layers 605b(a) and 605b(d). Each of the conductive layers 605a(a) to 605a(d) and the conductive layers 605b(a) and 605b(d) can be formed to have a stacked-layer structure including a layer of an alloy material containing copper, magnesium, and aluminum and a layer containing copper.

Each of the conductive layers 605a(a) to 605a(d) and the conductive layers 605b(a) and 605b(d) can be a layer containing conductive metal oxide. Examples of the conductive metal oxide are indium oxide, tin oxide, zinc oxide, indium oxide and tin oxide, and indium oxide and zinc oxide. Note that silicon oxide may be contained in conductive metal oxide that can be used for the conductive layers 605a(a) to 605a(d) and the conductive layers 605b(a) and 605b(d).

Each of the insulating layer 606(a) and the insulating layer 606(b) can be a layer of materials that can be used for the insulating layers 602(a) to 602(d). The insulating layers 606(a) and 606(b) can be formed to have a stacked-layer structure of materials that can be used for the insulating layers 606(a) and 606(b). For example, each of the insulating layers 606(a) and 606(b) may be formed using a silicon oxide layer, an aluminum oxide layer, or the like. For example, application of an aluminum oxide layer to the insulating layers 606(a) and 606(b) can more effectively prevent an impurity (water) from entering the oxide semiconductor layers 603(a) and 603(b) and effectively prevent the oxide semiconductor layers 603(a) and 603(b) from releasing oxygen.

The conductive layers 608(a) and 608(b) each function as a gate of the transistor. Note that when the transistor includes both of the conductive layers 601(a) and 608(a) or both of the conductive layers 601(b) and 608(b), one of the conductive layers 601(a) and 608(a) or one of the conductive layers 601(b) and 608(b) is also referred to as a back gate, a back gate electrode, or a back gate wiring. A plurality of conductive layers each functioning as a gate is provided with the channel formation layer provided therebetween, whereby the threshold voltage of the transistor can be easily controlled.

Each of the conductive layers 608(a) and 608(b) can be a layer of materials that can be used for the conductive layers 601(a) to 601(d), for example. The conductive layers 608(a) and 608(b) may be formed to have a stacked-layer structure of layers of materials that can be used for the conductive layers 608(a) and 608(b).

Alternatively, an insulating layer functioning as a channel protective layer may be formed to have a stacked-layer structure of materials that can be used for the insulating layers 602(a) to 602(d).

Alternatively, base layers may be formed over the element formation layers 600(a) to 600(d) and the transistors may be formed over the base layers. At that time, the base layer can be a layer of materials that can be used for the insulating layers 602(a) to 602(d), for example. Alternatively, the base layer may be formed to have a stacked-layer structure of materials that can be used for the insulating layers 602(a) to 602(d). For example, a base layer formed using a stacked-layer structure of an aluminum oxide layer and a silicon oxide layer can prevent the base layer from releasing oxygen through the oxide semiconductor layers 603(a) to 603(d).

When the insulating layers in contact with the oxide semiconductor layers 603(a) to 603(d) contain excess oxygen, the oxygen can be more easily supplied to the oxide semiconductor layers 603(a) to 603(d). In this case, oxygen defects can be reduced in the oxide semiconductor layers 603(a) to 603(d) and at interfaces between the insulating layers and the oxide semiconductor layers 603(a) to 603(d); therefore, carrier concentrations of the oxide semiconductor layers 603(a) to 603(d) can be reduced. The function of the insulating layer is not limited to the above. For example, the insulating layer in contact with the oxide semiconductor layer 603(a) may have a function of preventing the oxide semiconductor layer 603(a) from releasing oxygen even when the oxide semiconductor layer 603(a) contains excess oxygen through manufacturing steps.

<Characteristics of Transistor Including Oxide Semiconductor>

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon\, n} = \frac{e^3 N^2 t}{8\varepsilon\, C_{ox} V_g} \quad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\,\mu\,V_g V_d C_{ox}}{L} \exp\left(-\frac{E}{kT}\right) \quad \text{[FORMULA 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\,\mu\,V_d C_{ox}}{L}\right) - \frac{E}{kT} = \quad \text{[FORMULA 5]}$$
$$\ln\left(\frac{W\,\mu\,V_d C_{ox}}{L}\right) - \frac{e^3 N^2 t}{8kT\,\varepsilon\,C_{ox} V_g}$$

The right side of Formula 5 is a function of $V_g$. From the formula, it is found that the defect density N can be obtained from the slope with $1/V_g$ as the abscissa. That is, the defect density can be evaluated from the $V_g$–$I_d$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, or the like, $\mu_0$ can be calculated to be 120 cm²/Vs from Formula 2 and Formula 3. The measured mobility of a transistor that uses an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor film is expected to be 120 cm²/Vs.

Note that even when no defect exists inside a semiconductor, scattering at an interface between the channel and a gate insulating film affects the transport property of the transistor. In other words, the mobility $\mu_1$ at a position that is distance x away from the interface between the semiconductor and the gate insulating film can be expressed as the following formula.

$$\frac{1}{\mu_1} = \frac{1}{\mu_0} + \frac{D}{B}\exp\left(-\frac{x}{G}\right) \quad \text{[FORMULA 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 10:
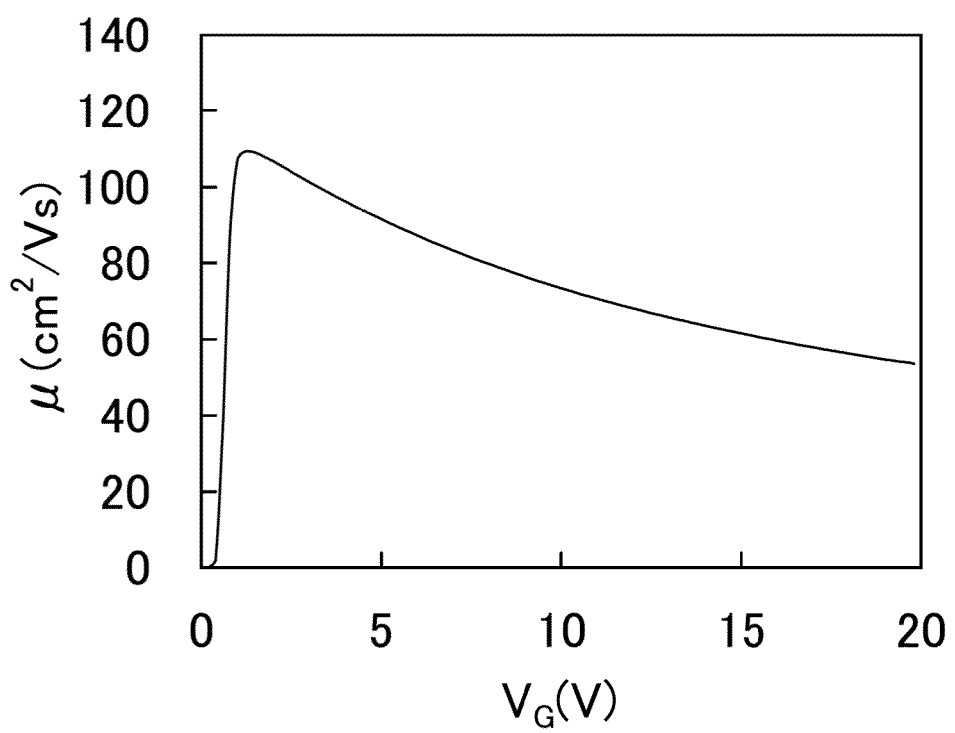
FIG. 10 shows the gate voltage dependence of mobility obtained by calculation.

Calculation results of the mobility $\mu$ of a transistor whose channel includes an ideal oxide semiconductor without a defect inside the semiconductor are shown in FIG. 10. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 10, the mobility has a peak of more than 100 cm²/Vs at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors which are manufactured using such an oxide semiconductor with the mobility are shown in FIGS. 11A to 11C, FIGS. 12A to 12C, and FIGS. 13A to 13C. FIGS. 14A and 14B illustrate cross-sectional structures of the transistors used for the calculation. The transistors illustrated in FIGS. 14A and 14B each include a semiconductor region 703a and a semiconductor region 703c which have n⁺-type conductivity in an oxide semiconductor layer. The resistivities of the semiconductor region 703a and the semiconductor region 703c are $2 \times 10^{-3}$ Ωcm.

The transistor illustrated in FIG. 14A is formed over a base insulating film 701 and an embedded insulator 702 which is embedded in the base insulating film 701 and formed of aluminum oxide. The transistor includes the semiconductor region 703a, the semiconductor region 703c, an intrinsic semiconductor region 703b serving as a channel formation region therebetween, and a gate 705. The width of the gate 705 is 33 nm.

A gate insulating film 704 is formed between the gate 705 and the semiconductor region 703b. In addition, a sidewall insulator 706a and a sidewall insulator 706b are formed on both side surfaces of the gate 705, and an insulator 707 is formed over the gate 705 so as to prevent a short circuit between the gate 705 and another wiring. The sidewall insulator has a width of 5 nm. A source 708a and a drain 708b are provided in contact with the semiconductor region 703a and the semiconductor region 703c, respectively. Note that the channel width of this transistor is 40 nm.

The transistor of FIG. 14B is the same as the transistor of FIG. 14A in that it is formed over the base insulating film 701 and the embedded insulator 702 formed of aluminum oxide and that it includes the semiconductor region 703a, the semiconductor region 703c, the semiconductor region 703b provided therebetween, the gate 705 having a width of 33 nm, the gate insulating film 704, the sidewall insulator 706a, the sidewall insulator 706b, the insulator 707, the source 708a, and the drain 708b.

The transistor illustrated in FIG. 14A is different from the transistor illustrated in FIG. 14B in the conductivity type of semiconductor regions under the sidewall insulator 706a and the sidewall insulator 706b. In the transistor illustrated in FIG. 14A, the semiconductor regions under the sidewall insulator 706a and the sidewall insulator 706b are part of the semiconductor region 703a having n'-type conductivity and part of the semiconductor region 703c having n⁺-type conductivity, whereas in the transistor illustrated in FIG. 14B, the semiconductor regions under the sidewall insulator 706a and the sidewall insulator 706b are part of the intrinsic semiconductor region 703b. In other words, a region having a width of $L_{off}$ which overlaps with neither the semiconductor region 703a (the semiconductor region 703c) nor the gate 705 is provided. This region is called an offset region, and the width $L_{off}$ is called an offset length. As is seen from the drawing, the offset length is equal to the width of the sidewall insulator 706a (the sidewall insulator 706b).

Figure 11A:
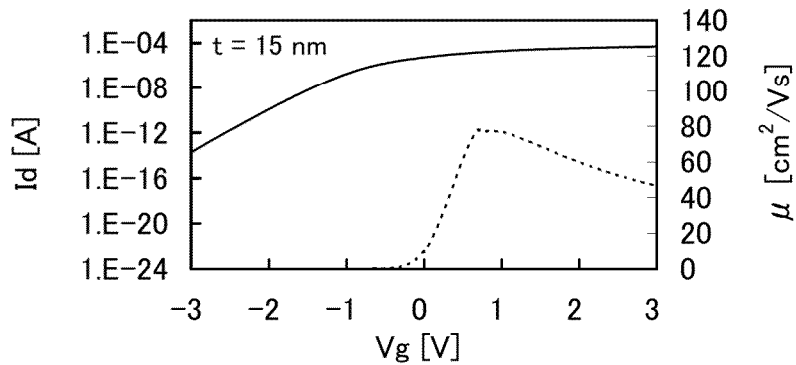
FIGS. 11A to 11C each show the gate voltage dependence of drain current and mobility obtained by calculation.
Figure 11B:
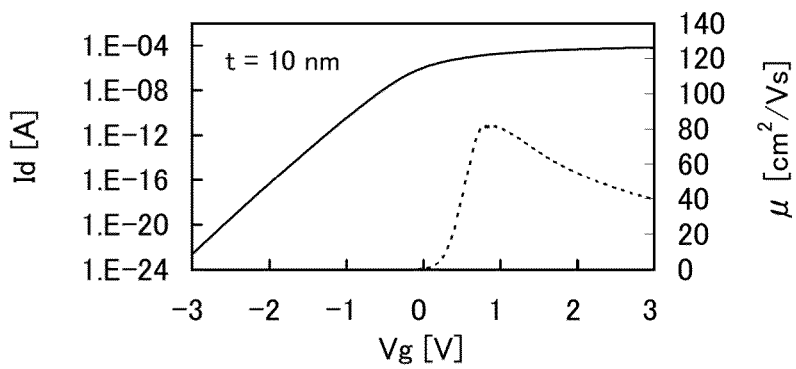
Figure 11C:
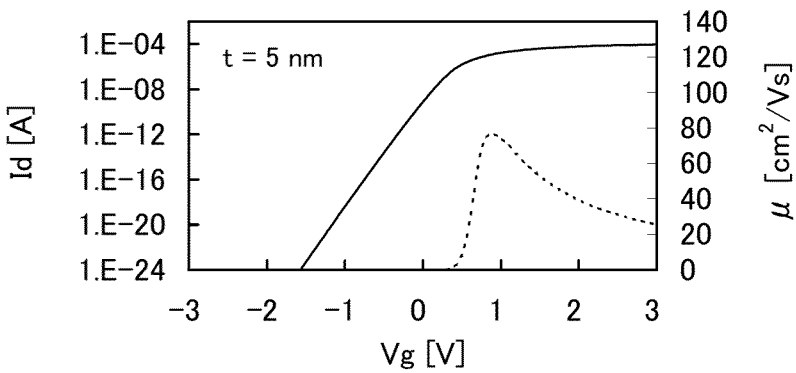

The other parameters used in calculation are as described above. For the calculation, device simulation software Sentaurus Device manufactured by Synopsys, Inc. was used. FIGS. 11A to 11C show the gate voltage ($V_g$: a potential difference between the gate and the source) dependence of the drain current ($I_d$, a solid line) and the mobility ($\mu$, a dotted line) of the transistor having the structure illustrated in FIG. 14A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 11A shows the gate voltage dependence of the transistor in the case where the thickness of the gate insulating film is 15 nm, FIG. 11B shows that of the transistor in the case where the thickness of the gate insulating film is 10 nm, and FIG. 11C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 12A:
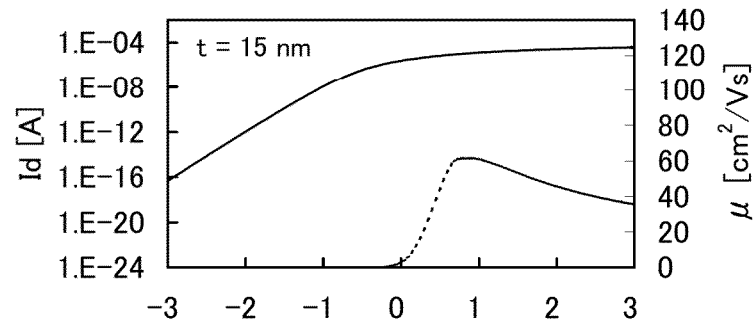
FIGS. 12A to 12C each show the gate voltage dependence of drain current and mobility obtained by calculation.
Figure 12B:
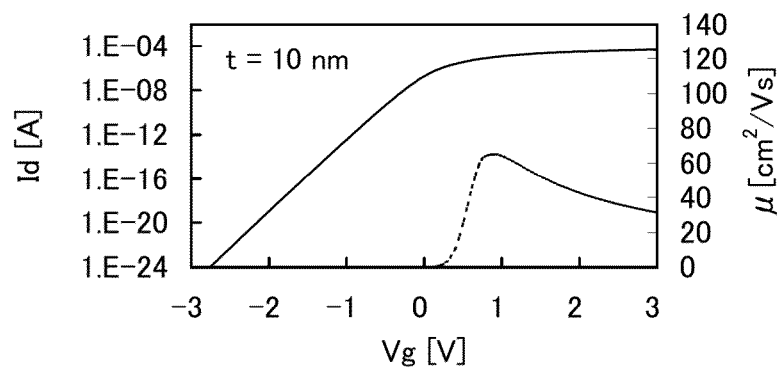
Figure 12C:
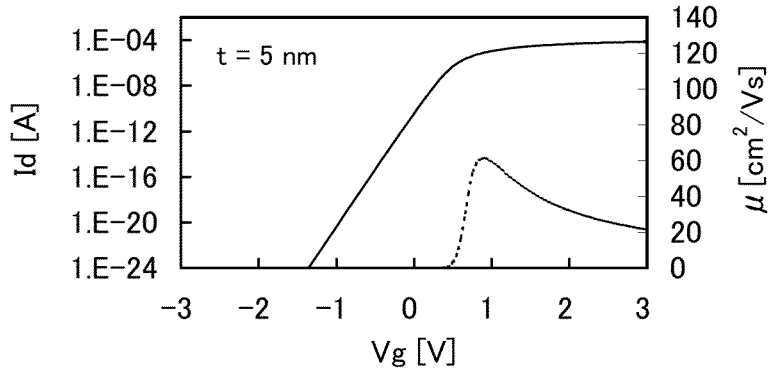

FIGS. 12A to 12C show the gate voltage $V_g$ dependence of the drain current $I_d$ (a solid line) and the mobility μ (a dotted line) of the transistor having the structure illustrated in FIG. 14B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 12A shows the gate voltage dependence of the transistor in the case where the thickness of the gate insulating film is 15 nm, FIG. 12B shows that of the transistor in the case where the thickness of the gate insulating film is 10 nm, and FIG. 12C shows that of the transistor in the case where the thickness of the gate insulating film is 5 nm.

Figure 13A:
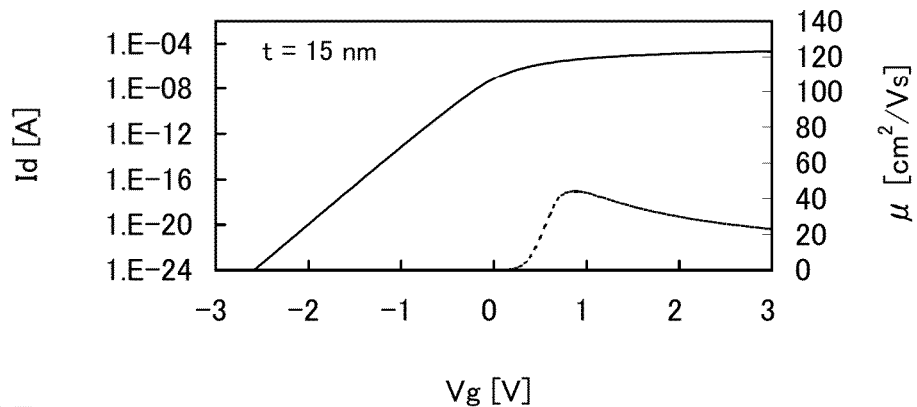
FIGS. 13A to 13C each show the gate voltage dependence of drain current and mobility obtained by calculation.
Figure 13B:
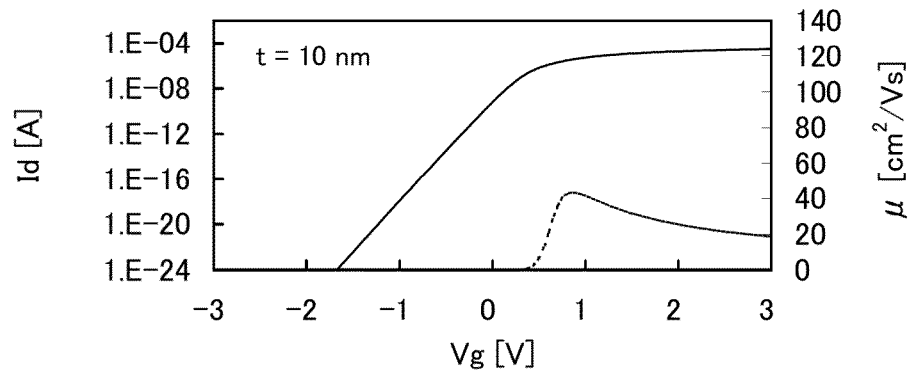
Figure 13C:
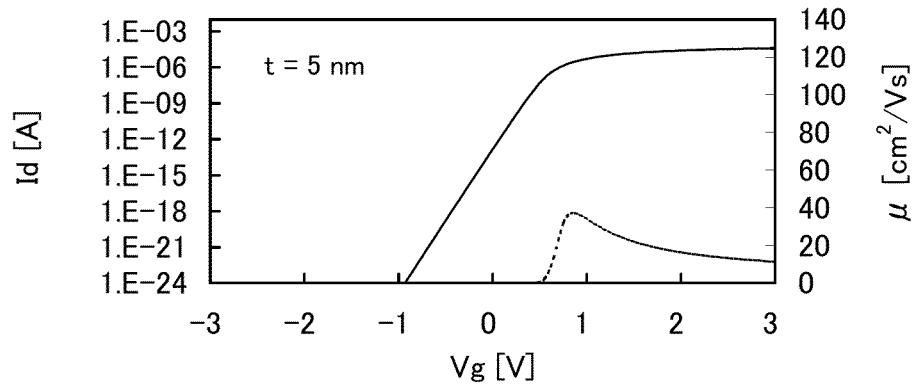
Figure 14A:
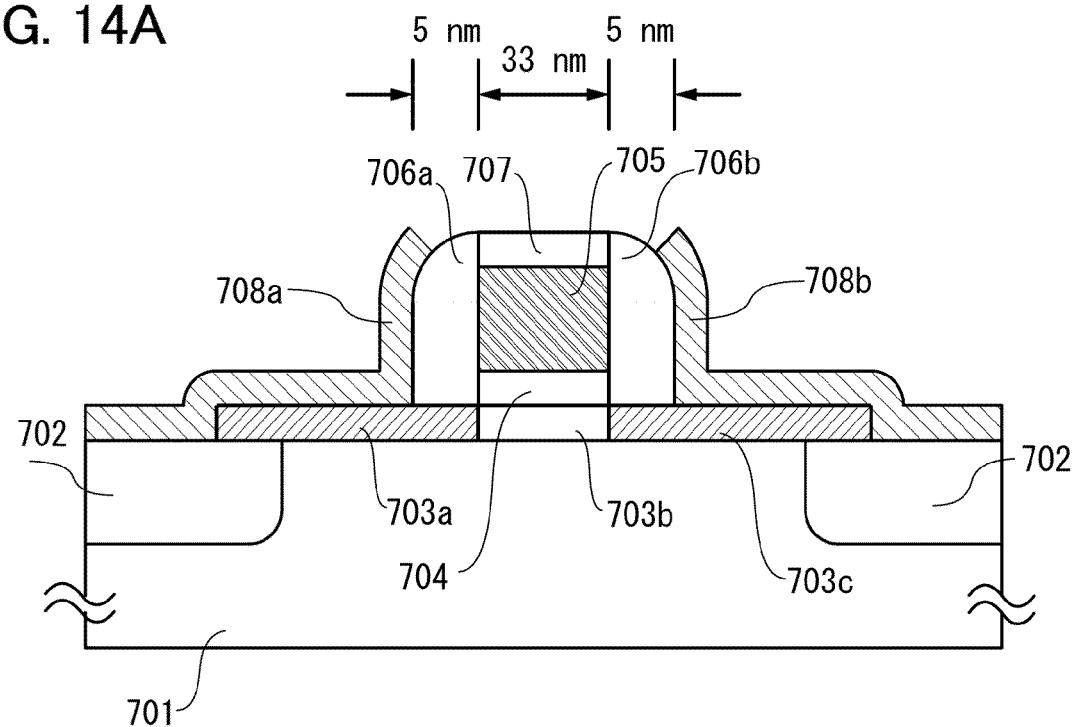
FIGS. 14A and 14B each illustrate an example of a cross-sectional structure of a transistor used for calculation.
Figure 14B:
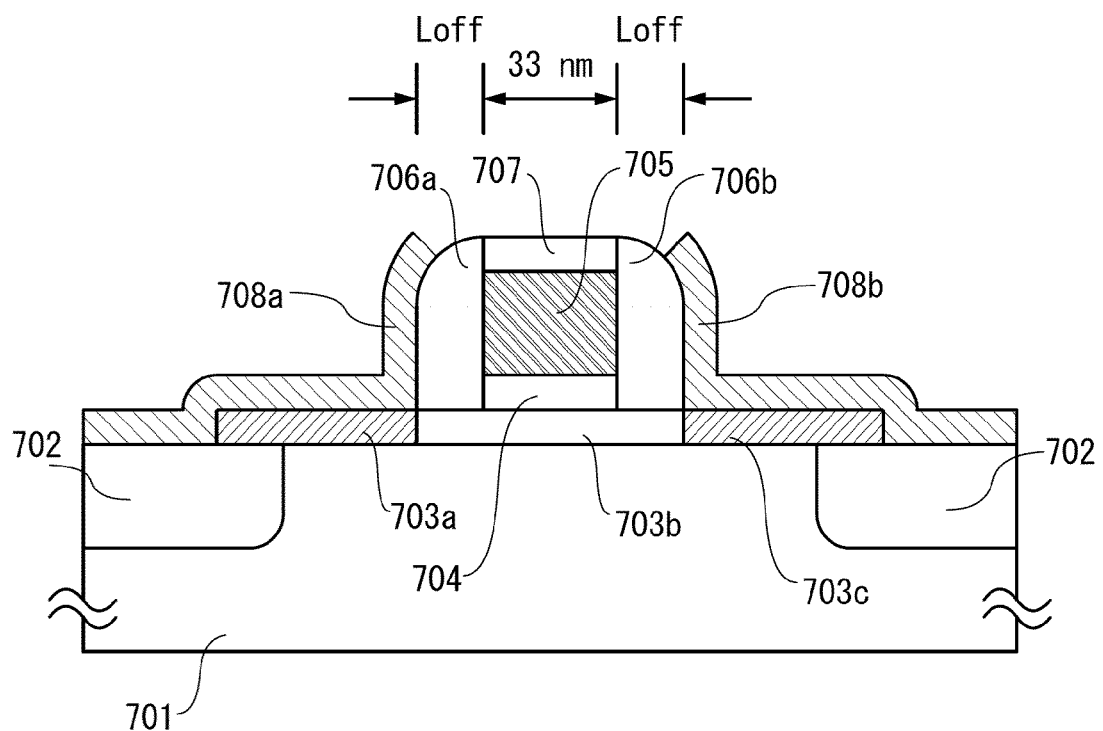

Further, FIGS. 13A to 13C show the gate voltage dependence of the drain current $I_d$ (a solid line) and the mobility μ (a dotted line) of the transistor having the structure illustrated in FIG. 14B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 13A shows the gate voltage dependence of the transistor in the case where the thickness of the gate insulating film is 15 nm, FIG. 13B shows that of the transistor in the case where the thickness of the gate insulating film is 10 nm, and FIG. 13C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 11A to 11C, approximately 60 cm$^2$/Vs in FIGS. 12A to 12C, and approximately 40 cm$^2$/Vs in FIGS. 13A to 13C; thus, the peak of the mobility μ is decreased as the offset length $L_{off}$ is increased. Further, the same applies to the off-state current. The on-state current is decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

<Characteristics of Transistor Including In—Sn—Zn-Based Oxide>

A transistor using an In—Sn—Zn-based oxide as an oxide semiconductor is described.

A transistor in which an oxide semiconductor including In, Sn, and Zn as main components is used as a channel formation region can have favorable characteristics by depositing the oxide semiconductor while heating a substrate or by performing heat treatment after an oxide semiconductor layer is formed. Note that a main component refers to an element included in a composition at 5 atomic % or more.

By intentionally heating the substrate after formation of the oxide semiconductor layer including In, Sn, and Zn as main components, the field-effect mobility of the transistor can be improved. Further, the threshold voltage of the transistor can be positively shifted to make the transistor normally off.

Figure 15A:
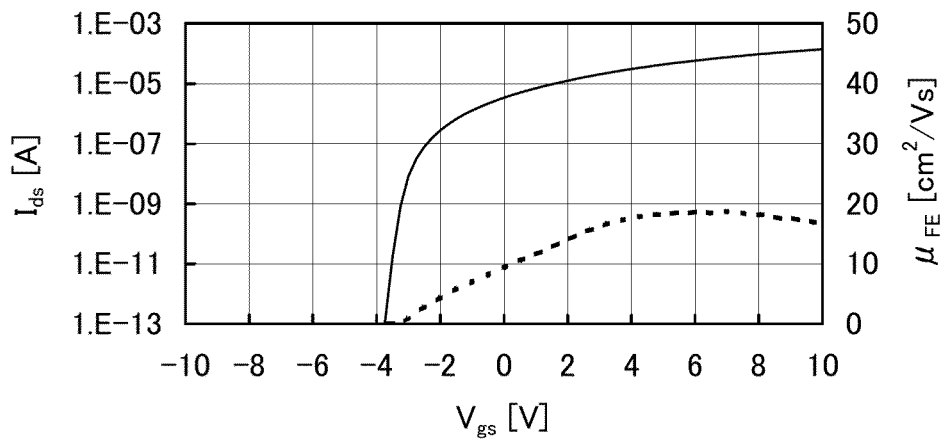
FIGS. 15A to 15C each show characteristics of a transistor including an oxide semiconductor layer.
Figure 15B:
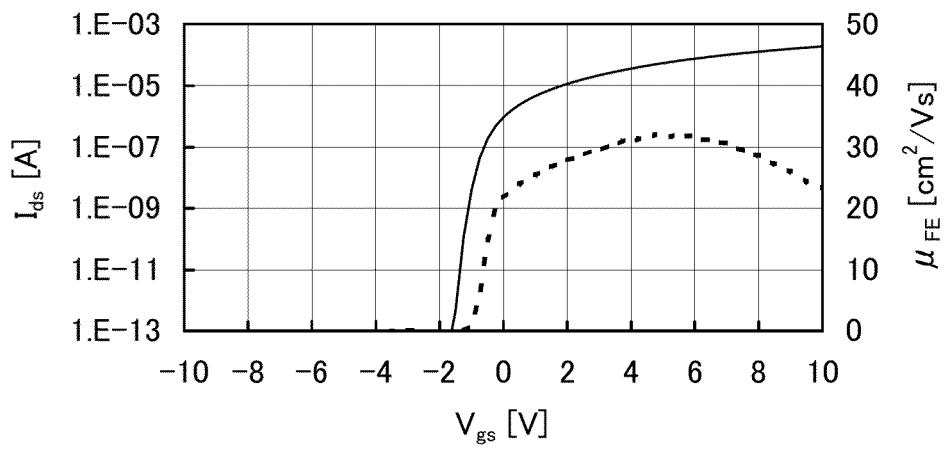
Figure 15C:
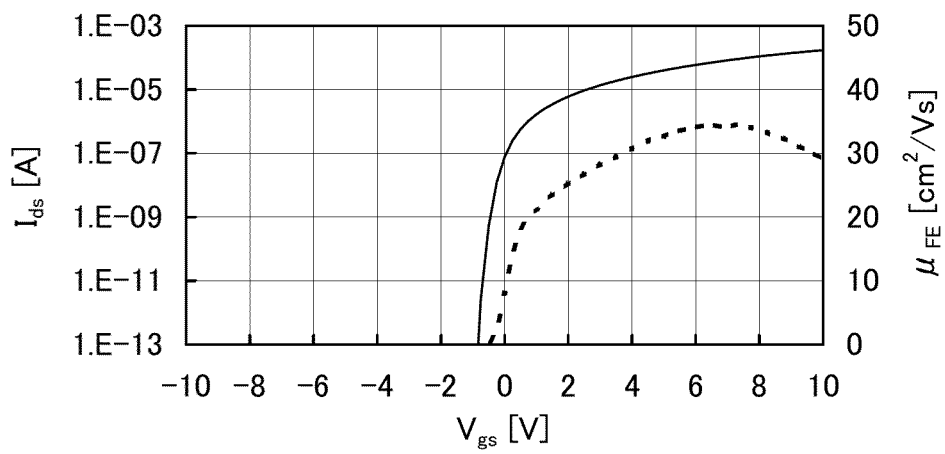

As an example, FIGS. 15A to 15C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 15A shows characteristics of a transistor whose oxide semiconductor layer including In, Sn, and Zn as main components was formed by a sputtering method without heating a substrate intentionally. The field-effect mobility of the transistor is 18.8 cm$^2$/Vsec. On the other hand, when the oxide semiconductor layer including In, Sn, and Zn as main components is formed while heating the substrate intentionally, the field-effect mobility can be improved. FIG. 15B shows characteristics of a transistor whose oxide semiconductor layer including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor layer including In, Sn, and Zn as main components. FIG. 15C shows characteristics of a transistor whose oxide semiconductor layer including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor layer during the formation by sputtering. Further, the heat treatment after film formation enables hydrogen, a hydroxyl group, or moisture to be released and removed from the oxide semiconductor layer. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor layer that includes In, Sn, and Zn as main components and is formed without heating a substrate intentionally is used as a channel formation region, the threshold voltage tends to be shifted negatively. However, when the oxide semiconductor layer formed while heating the substrate intentionally is used, the problem of the negative shift of the threshold voltage can be solved. That is, the threshold voltage is shifted so that the transistor becomes normally off; this tendency can be confirmed by comparison between FIGS. 15A and 15B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor layer having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor layer, and Sample 2 on which heat treatment at 650° C. was performed after formation of an oxide semiconductor layer.

First, $V_{gs}$–$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, 20 V of $V_{gs}$ was applied so that the intensity of an electric field applied to a gate insulating film was 2 MV/cm, and the condition was kept for one hour. Next, $V_{gs}$ was set to 0 V. Then, $V_{gs}$–$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set at 150° C. and $V_{ds}$ was set to 0.1 V. After that, −20 V of $V_{gs}$ was applied so that the intensity of an electric field applied to the gate insulating film was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 16A:
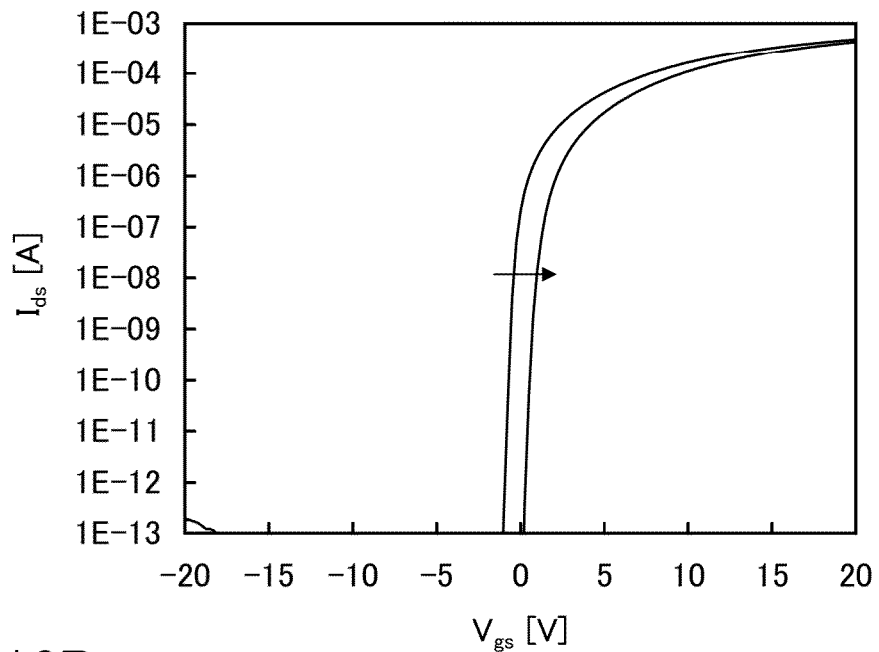
FIGS. 16A and 16B each show $V_{gs}-I_{ds}$ characteristics after BT tests of a transistor of Sample 1.
Figure 16B:
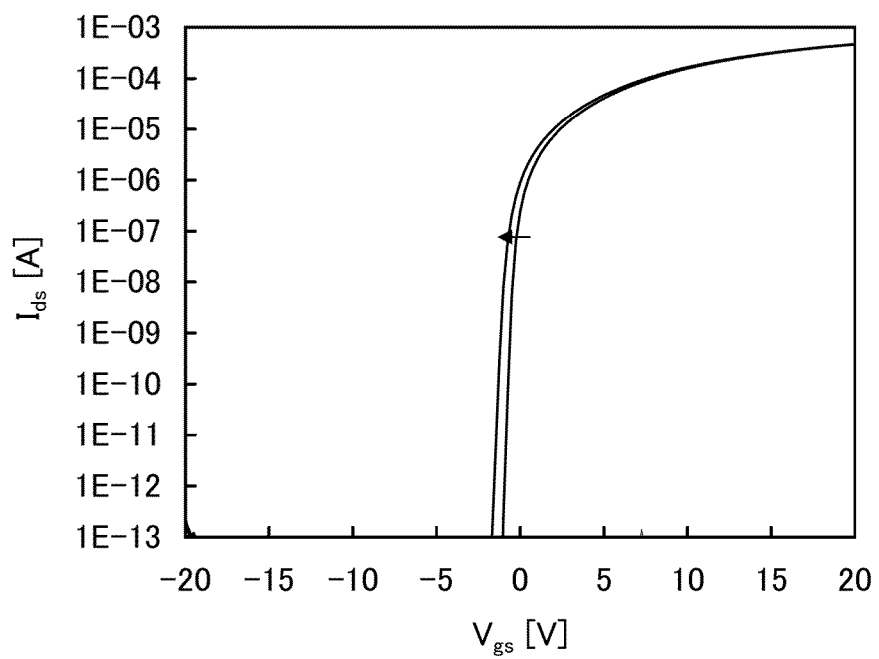
Figure 17A:
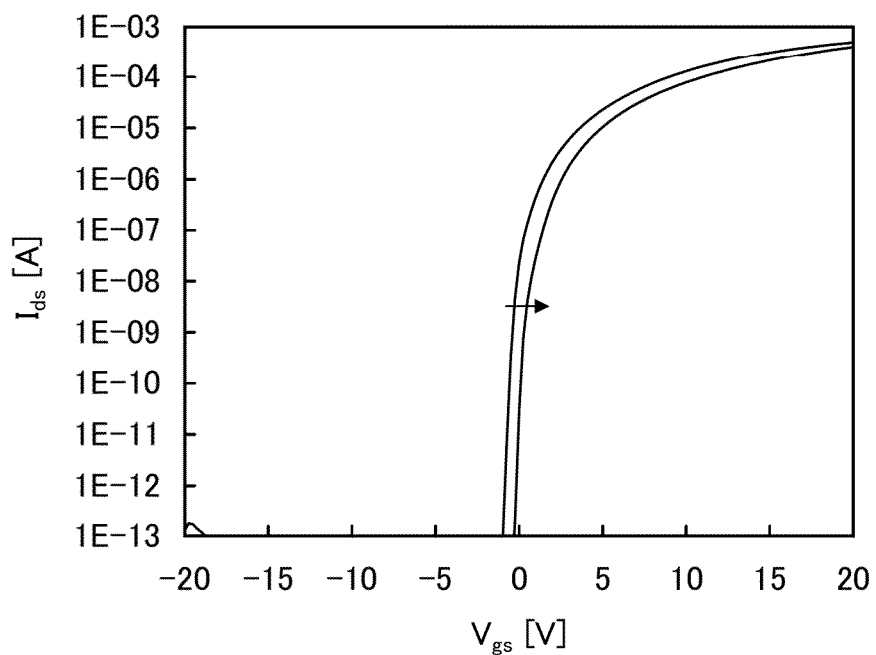
FIGS. 17A and 17B each show $V_{gs}-I_{ds}$ characteristics after a BT test of a transistor of Sample 2.
Figure 17B:
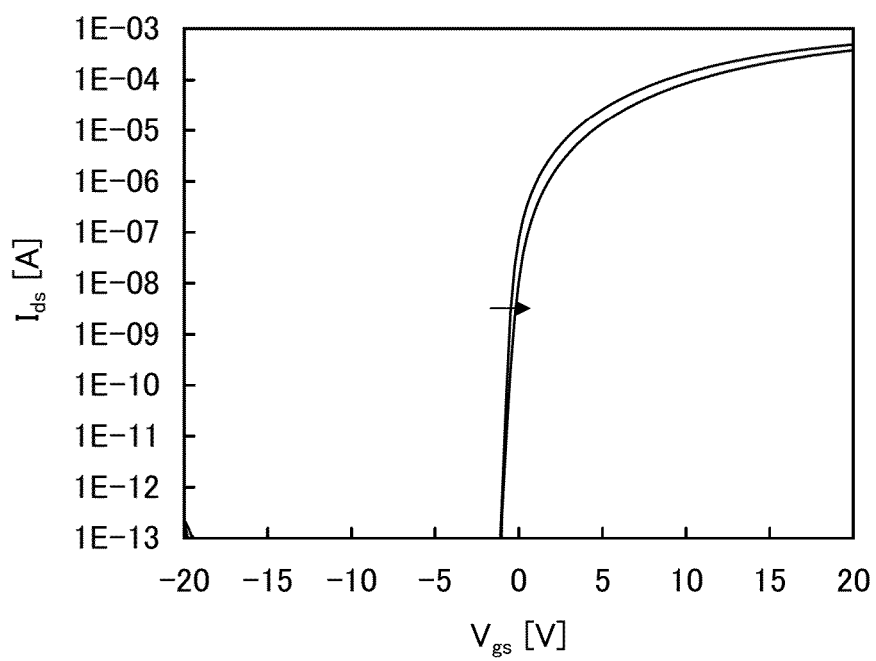

FIGS. 16A and 16B show a result of the positive BT test of Sample 1 and a result of the negative BT test of Sample 1, respectively. FIGS. 17A and 17B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor layer may be employed.

A defect due to oxygen deficiency is easily caused in the oxide semiconductor or at an interface between the oxide semiconductor and another film; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}$/cm$^3$ and lower than or equal to $2 \times 10^{20}$/cm$^3$, excess oxygen can be included in the oxide semiconductor without causing crystal distortion or the like.

When heat treatment is performed so that at least part of the oxide semiconductor includes crystal, a more stable oxide semiconductor layer can be obtained. For example, when an oxide semiconductor layer which is formed by sputtering using a target having a composition ratio of In:Sn:Zn=1:1:1 without heating a substrate intentionally is analyzed by X-ray diffraction (XRD), a halo pattern is observed. The formed oxide semiconductor layer can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn-based oxide film with a thickness of 100 nm was formed over a quartz substrate that had been subjected to dehydrogenation treatment.

The In—Sn—Zn-based oxide film was formed with a sputtering apparatus with a power of 100 W (DC) in an oxygen atmosphere. An In—Sn—Zn-based oxide target having a ratio of In:Sn:Zn=1:1:1 (at an atomic ratio) was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 18:
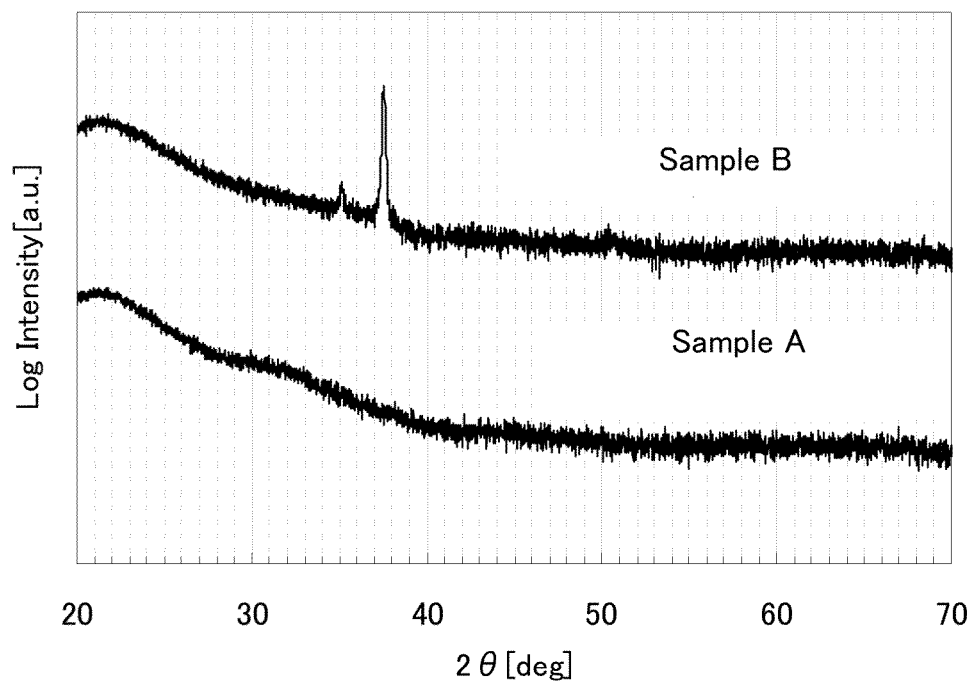
FIG. 18 shows XRD spectra of Sample A and Sample B.

FIG. 18 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 19:
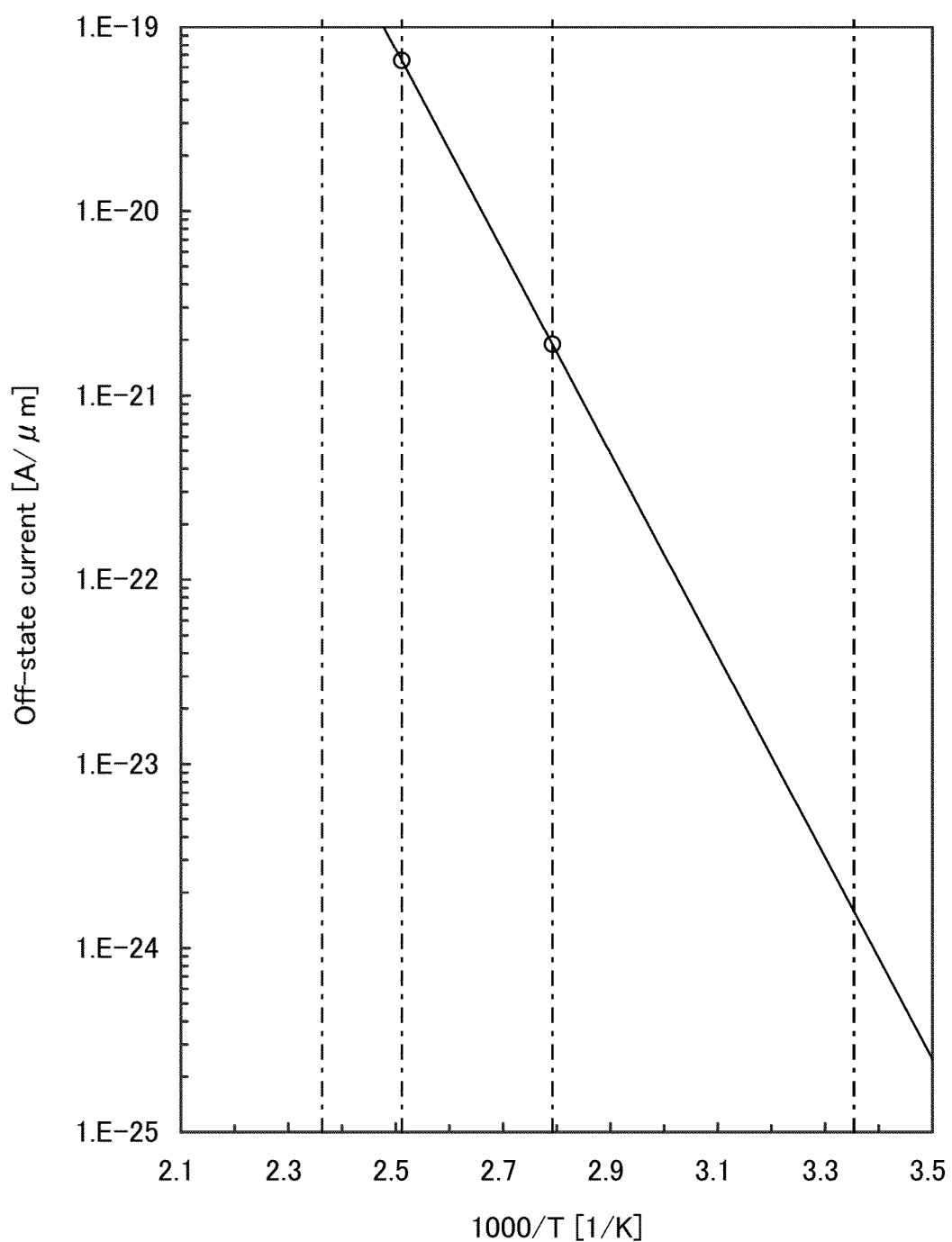
FIG. 19 shows a relation between the off-state current of a transistor and the substrate temperature in measurement.

FIG. 19 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 19, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor layer during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor layer, was evaluated.

The transistor used for the measurement has a channel length L of 3 µm, a channel width W of 10 µm, Lov of 0 µm, and dW of 0 µm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor layer, is referred to as dW.

Figure 20:
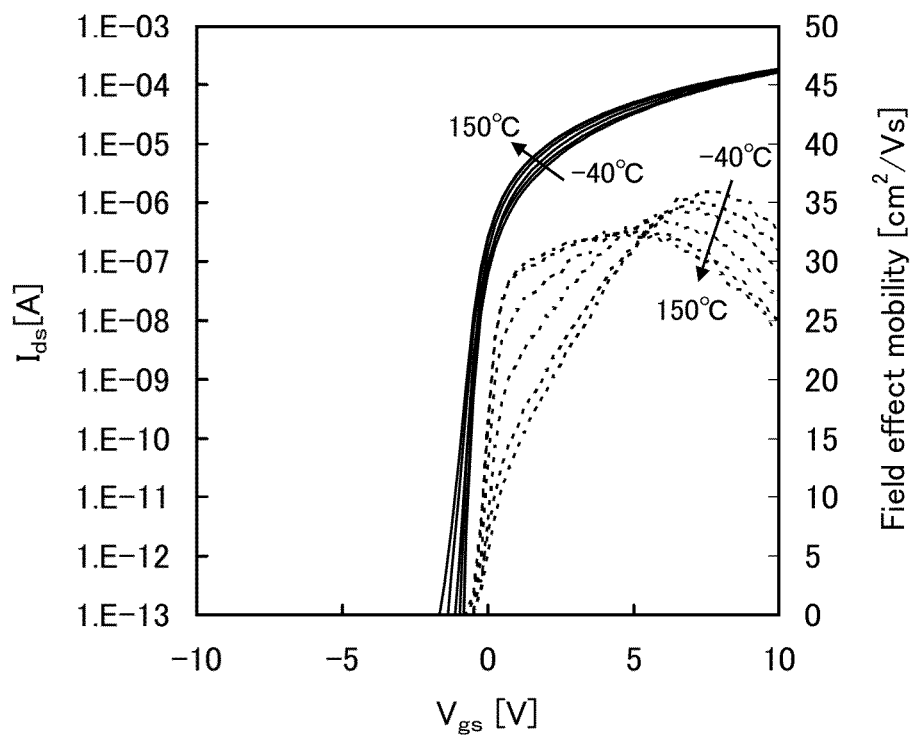
FIG. 20 shows $V_{gs}$ dependence of $I_{ds}$ and field effect mobility.
Figure 21A:
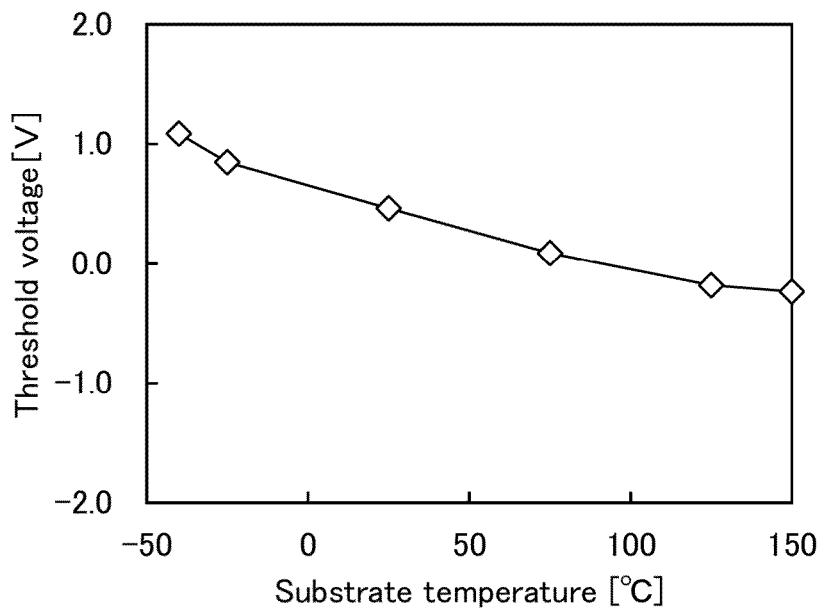
FIGS. 21A and 21B show the relation between substrate temperature and threshold voltage and a graph showing the relation between substrate temperature and field effect mobility, respectively.

FIG. 20 shows the $V_{gs}$ dependence of $I_{ds}$ (a solid line) and field-effect mobility (a dotted line). FIG. 21A shows a relation between the substrate temperature and the threshold voltage, and FIG. 21B shows a relation between the substrate temperature and the field-effect mobility.

From FIG. 21A, it is found that the threshold voltage gets lower as the substrate temperature increases. Note that the threshold voltage is decreased from 1.09 V to −0.23 V in the range from −40° C. to 150° C.

Figure 21B:
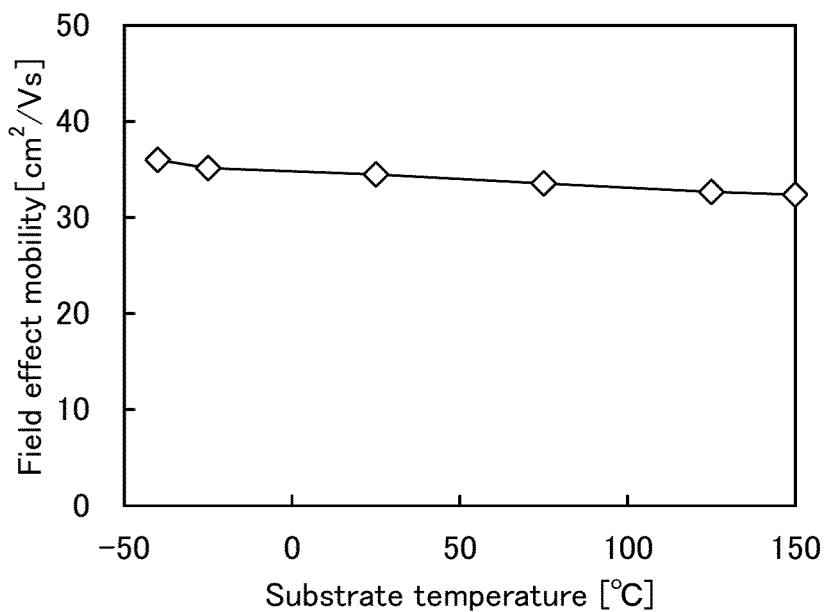

From FIG. 21B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/µm or lower, which can achieve on-state current needed for an LSI. For example, in an FET where L/W is 33 nm/40 nm, an on-state current of 12 µA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

<Example of Transistor Including In—Sn—Zn-Based Oxide Film>

In this example, an example of a transistor in which an In—Sn—Zn-based oxide film is used as an oxide semiconductor layer will be described with reference to FIGS. 22A and 22B and FIGS. 23A and 23B.

Figure 22A:
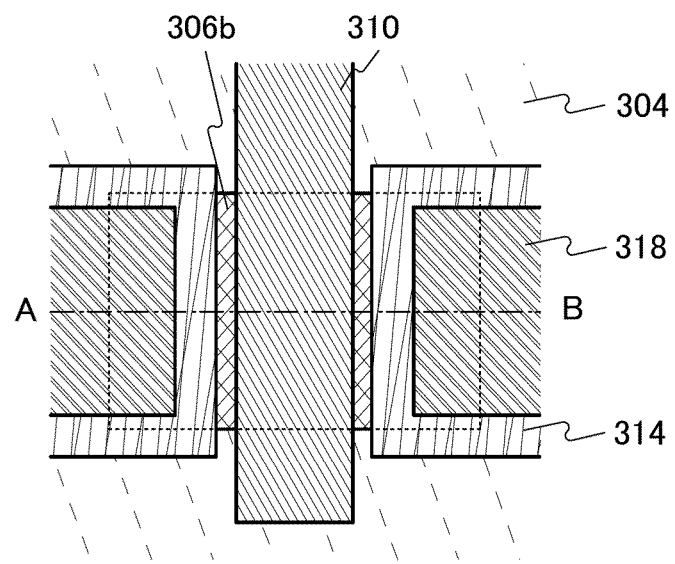
FIGS. 22A and 22B are a top view of a semiconductor device and a cross-sectional view thereof, respectively.
Figure 22B:
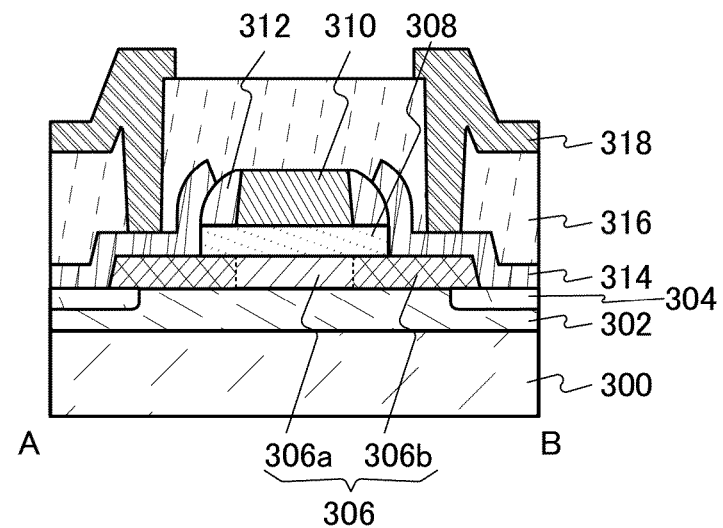

FIGS. 22A and 22B are a top view and a cross-sectional view of a coplanar transistor having a top-gate top-contact structure. FIG. 22A is the top view of the transistor. FIG. 22B shows cross section A-B along dashed-dotted line A-B in FIG. 22A.

The transistor shown in FIG. 22B includes a substrate 300; a base insulating film 302 provided over the substrate 300; a protective insulating film 304 provided in the periphery of the base insulating film 302; an oxide semiconductor layer 306 provided over the base insulating film 302 and the protective insulating film 304 and including a high-resistance region 306a and low-resistance regions 306b; a gate insulating film 308 provided over the oxide semiconductor layer 306; a gate electrode 310 provided to overlap with the oxide semiconductor layer 306 with the gate insulating film 308 interposed therebetween; a sidewall insulating film 312 provided in contact with a side surface of the gate electrode 310; a pair of electrodes 314 provided in contact with at least the low-resistance regions 306b; an interlayer insulating film 316 provided to cover at least the oxide semiconductor layer 306, the gate electrode 310, and the pair of electrodes 314; and a wiring 318 provided to connect to at least one of the pair of electrodes 314 through an opening formed in the interlayer insulating film 316.

Although not shown, a protective film may be provided to cover the interlayer insulating film 316 and the wiring 318. With the protective film, a minute amount of leakage current generated by surface conduction of the interlayer insulating film 316 can be reduced and thus the off-state current of the transistor can be reduced.

Another example of a transistor in which an In—Sn—Zn-based oxide film is used as an oxide semiconductor layer will be described.

Figure 23A:
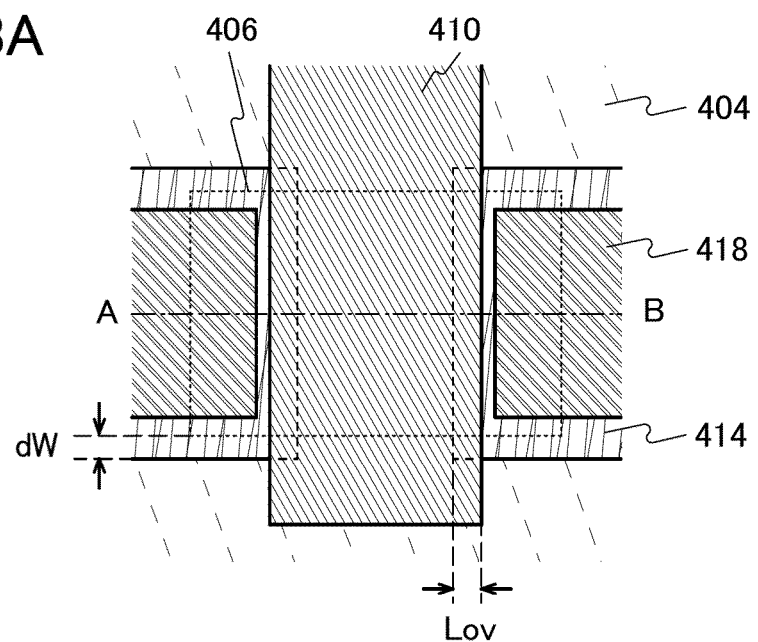
FIGS. 23A and 23B are a top view of a semiconductor device and a cross-sectional view thereof, respectively.
Figure 23B:
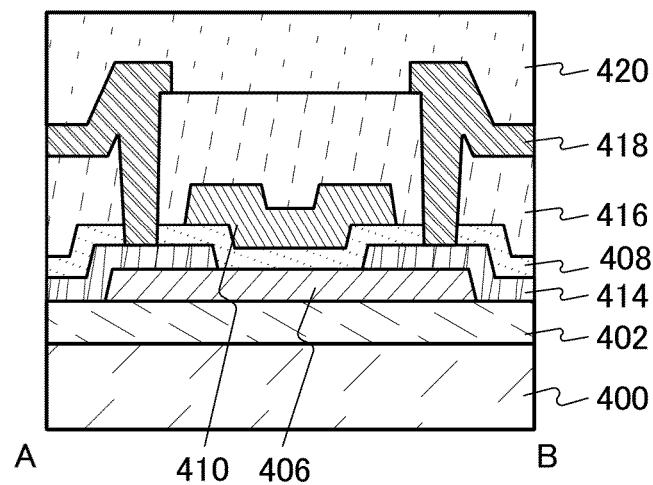

FIGS. 23A and 23B are a top view and a cross-sectional view which show a structure of a transistor manufactured in this example. FIG. 23A is the top view of the transistor. FIG. 23B is a cross-sectional view along dashed-dotted line A-B in FIG. 23A.

The transistor shown in FIG. 23B includes a substrate 400; a base insulating film 402 provided over the substrate 400; an oxide semiconductor layer 406 provided over the base insulating film 402; a pair of electrodes 414 provided in contact with the oxide semiconductor layer 406; a gate insulating film 408 provided over the oxide semiconductor layer 406 and the pair of electrodes 414; a gate electrode 410 provided to overlap with the oxide semiconductor layer 406 with the gate insulating film 408 interposed therebetween; an interlayer insulating film 416 provided to cover the gate insulating film 408 and the gate electrode 410; wirings 418 connected to the pair of electrodes 414 through openings formed in the interlayer insulating film 416; and a protective film 420 provided to cover the interlayer insulating film 416 and the wirings 418.

As the substrate 400, a glass substrate was used. As the base insulating film 402, a silicon oxide film was used. As the oxide semiconductor layer 406, an In—Sn—Zn-based oxide film was used. As the pair of electrodes 414, a tungsten film was used. As the gate insulating film 408, a silicon oxide film was used. The gate electrode 410 had a stacked-layer structure of a tantalum nitride film and a tungsten film. The interlayer insulating film 416 had a stacked-layer structure of a silicon oxynitride film and a polyimide film. The wirings 418 each had a stacked-layer structure in which a titanium film, an aluminum film, and a titanium film were formed in this order. As the protective film 420, a polyimide film was used.

Note that in the transistor having the structure shown in FIG. 23A, the width of a portion where the gate electrode 410 overlaps with one of the pair of electrodes 414 is referred to as Lov. Similarly, the width of a portion where the pair of electrodes 414, which does not overlap with the oxide semiconductor layer 406, is referred to as dW.

<Modification Example of Power Supply Control Circuit 10>

The power supply control circuit 10 illustrated in FIGS. 1A to 1C is one embodiment of the present invention. The present invention includes the circuit configuration different from that in FIGS. 1A and 1B. For example, the power supply control circuit 10 can also employ the circuit configuration illustrated in FIG. 2A or the circuit configuration illustrated in FIG. 3A.

Figure 2A:
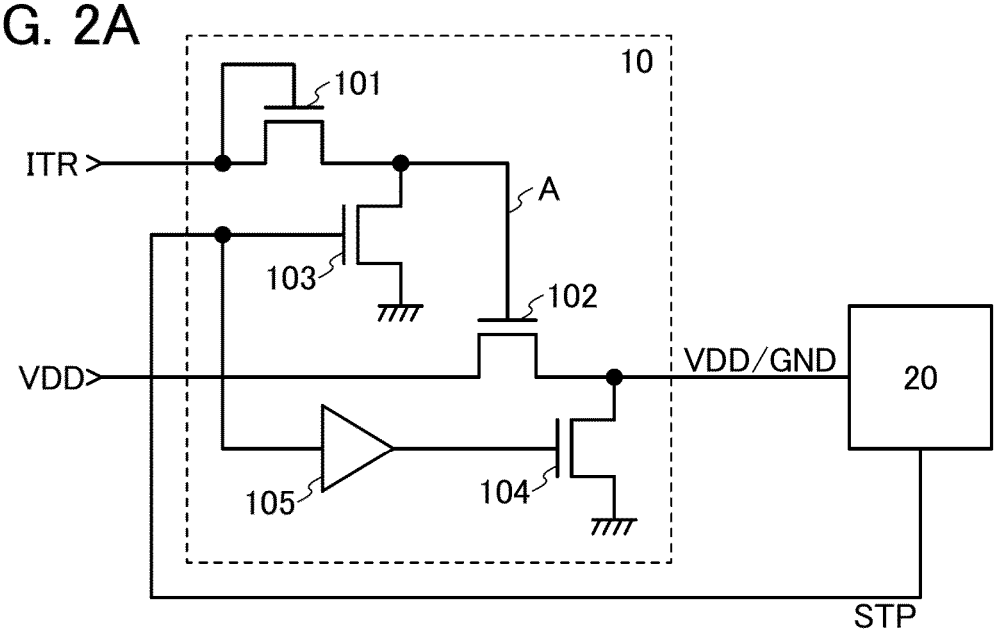
FIG. 2A illustrates a configuration example of a power supply control circuit.
Figure 2B:
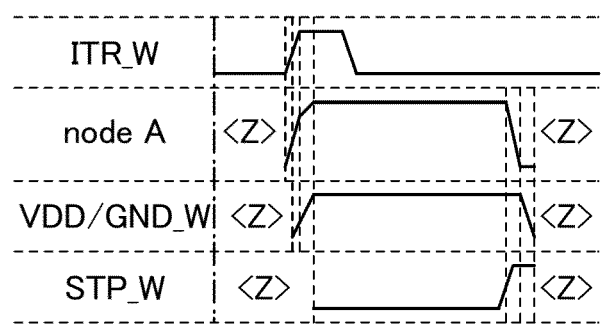

The power supply control circuit 10 illustrated in FIG. 2A is the circuit where a buffer 105 is added to the power supply control circuit 10 illustrated in FIG. 1B. An input terminal of the buffer 105 is electrically connected to the wiring for supplying the power supply stopping signal (STP) output from the signal processing circuit 20. An output terminal of the buffer 105 is electrically connected to the gate of the transistor 104. The buffer 105 can be a load, two inverters connected in series, or the like. The buffer 105 makes it possible to start decreasing the potential of the wiring (VDD/GND_W) after the beginning of a decrease of the potential of the node A (see FIG. 2B). This reduces the possibility that the wiring for supplying the power supply potential (VDD) is grounded.

Figure 3A:
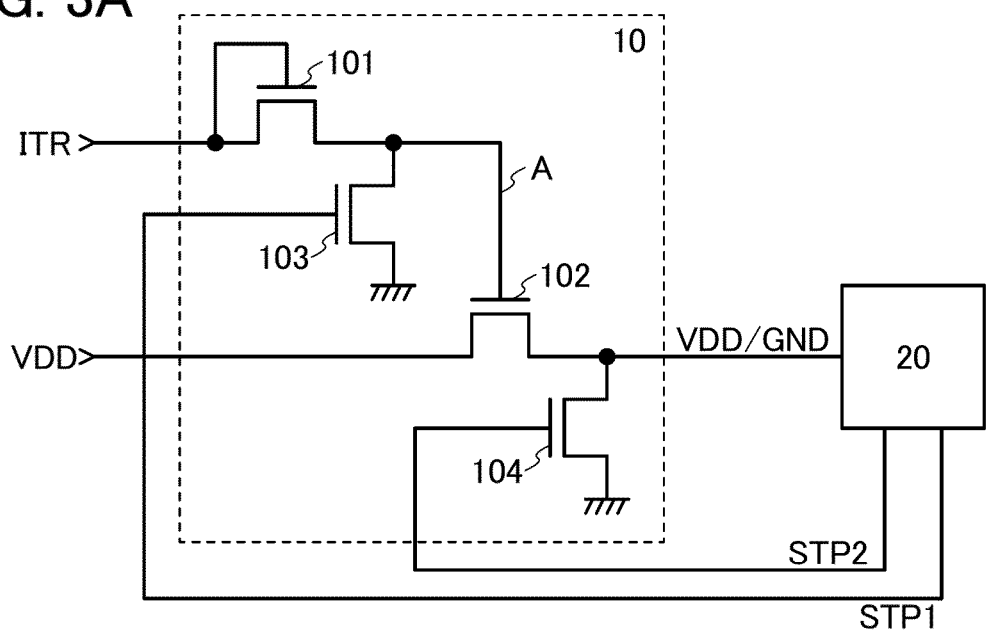
FIG. 3A illustrates a configuration example of a power supply control circuit.
Figure 3B:
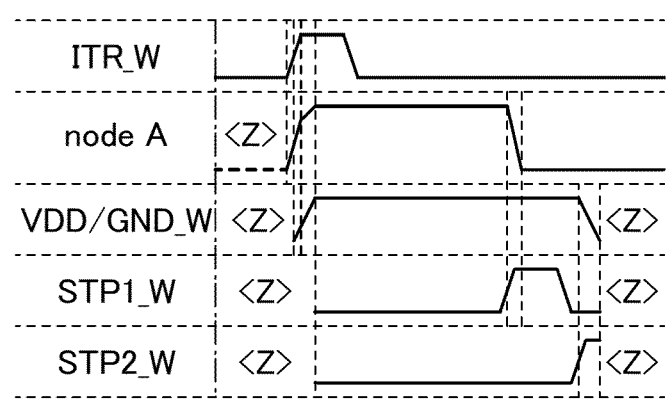

The power supply control circuit 10 illustrated in FIG. 3A is different from the power supply control circuit 10 illustrated in FIGS. 1A to 1C in that different power supply stopping signals (STP1 and STP2) are input to the gate of the transistor 103 and the gate of the transistor 104, respectively. Note that the signal processing circuit 20 outputs a power supply stopping signal (STP1) input to the gate of the transistor 103 before a power supply stopping signal (STP2) input to the gate of the transistor 104 (see FIG. 3B). Therefore, the potential of the wiring (VDD/GND_W) can start decreasing after the beginning of a decrease of the potential of the node A. This reduces the possibility that the wiring for supplying the power supply potential (VDD) is grounded.

<Configuration Example and Operation Example of Signal Processing Circuit 20>

Figure 4A:
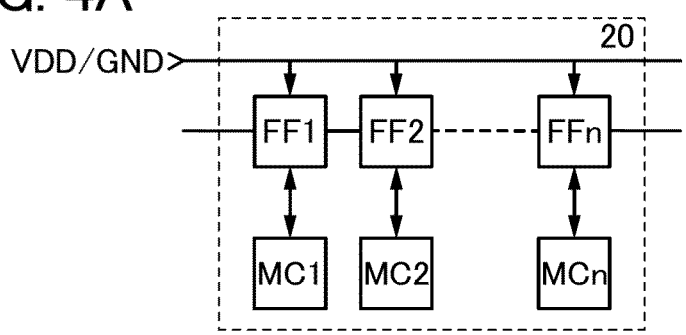
FIG. 4A illustrates a configuration example of a signal processing circuit, and FIGS. 4B and 4C each illustrate a configuration example of a memory cell.

FIG. 4A illustrates a configuration example of the signal processing circuit 20 illustrated in FIG. 1A. The signal processing circuit 20 illustrated in FIG. 4A includes n flip-flops (FF1 to FFn) and memory cells (MC1 to MCn) connected to respective n flip-flops.

The flip-flop (FF) is a volatile memory capable of holding 1-bit data. The memory cell (MC) is a non-volatile memory capable of holding 1-bit data. Further, data can be received or transmitted between the flip-flop (FF) and the memory cell (MC). Accordingly, the signal processing circuit 20 illustrated in FIG. 4A can transfer data from the flip-flop (FF) to the memory cell (MC) before supply of the power supply potential (VDD) is stopped, and can transfer data from the memory cell (MC) to the flip-flop (FF) when supply of the power supply potential (VDD) is resumed. That is, the data in the flip-flop (FF) can be temporarily held in the memory cell (MC) (in a period including the period where supply of the power supply potential (VDD) is stopped).

In this manner, power consumption is reduced by stop of supplying the power supply potential (VDD), and further, it is possible to shorten a period for restoring data (to improve processing speed) which is erased from the flip-flop (FF) owing to stopping of supply of the power supply potential (VDD).

Figure 4B:
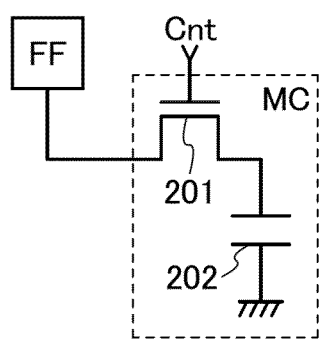
Figure 4C:
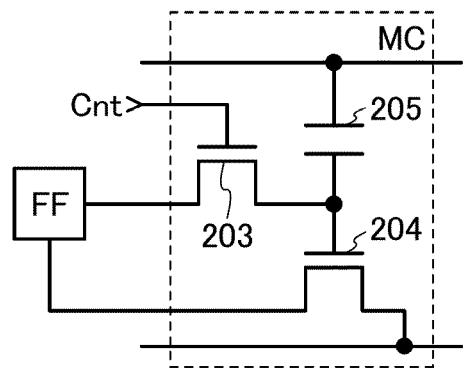

FIGS. 4B and 4C each illustrate a configuration example of the memory cell (MC) illustrated in FIG. 4A.

The memory cell (MC) illustrated in FIG. 4B includes a transistor 201 whose channel is formed in an oxide semiconductor layer and a capacitor 202. The gate of the transistor 201 is electrically connected to a wiring for supplying a control signal (Cnt). One of a source and a drain of the transistor 201 is electrically connected to the flip-flop (FF). One electrode of the capacitor 202 is electrically connected to the other of the source and the drain of the transistor 201. The other electrode of the capacitor 202 is grounded.

The memory cell (MC) holds data at a node where the other of the source and the drain of the transistor 201 is electrically connected to the one electrode of the capacitor 202. The transistor 201 is a transistor whose channel is formed in an oxide semiconductor layer. As described above, the transistor has extremely low cutoff current. Therefore, the memory cell (MC) can function as a non-volatile memory.

The memory cell (MC) illustrated in FIG. 4C includes a transistor 203 whose channel is formed in an oxide semiconductor layer, a transistor 204, and a capacitor 205. A gate of the transistor 203 is electrically connected to a wiring for supplying the control signal (Cnt). One of a source and a drain of the transistor 203 is electrically connected to the flip-flop (FF). A gate of the transistor 204 is electrically connected to the other of the source and the drain of the transistor 203. One of a source and a drain of the transistor 204 is electrically connected to the flip-flop (FF). The other of the source and the drain of the transistor 204 is electrically connected to a wiring for supplying a fixed potential. One electrode of the capacitor 205 is electrically connected to the other of the source and the drain of the transistor 203 and the gate of the transistor 204. The other electrode of the capacitor 205 is electrically connected to a wiring for supplying a fixed potential.

Note that the transistor 204 can be a transistor whose channel is formed in an oxide semiconductor layer and also can be a transistor whose channel is formed in a semiconductor layer other than the oxide semiconductor layer. Further, the fixed potential which is supplied from the wiring electrically connected to the other of the source and the drain of the transistor 204 can be the same as or different from the fixed potential which is supplied from the wiring electrically connected to the other electrode of the capacitor 205.

It is possible to apply a configuration where the capacitor 205 is eliminated from the above memory cell (MC).

The memory cell (MC) holds data at a node where the other of the source and the drain of the transistor 203, the gate of the transistor 204, and the one electrode of the capacitor 205 are electrically connected to one another. The flip-flop (FF) can obtain the data by identifying the state (an on state or an off state) of the transistor 204.

<Structural Example of Semiconductor Device>

Next, a structural example of the above semiconductor device is described with reference to FIG. 5.

A flip-flop (FF) included in the signal processing circuit 20 is formed using a transistor and the like. The transistor preferably has high field-effect mobility. Accordingly, transistors included in the flip-flop (FF) preferably have their channel in polycrystalline silicon layers or single crystal silicon layers while at least one of transistors included in the power supply control circuit 10 has its channel in an oxide semiconductor layer.

Figure 5:
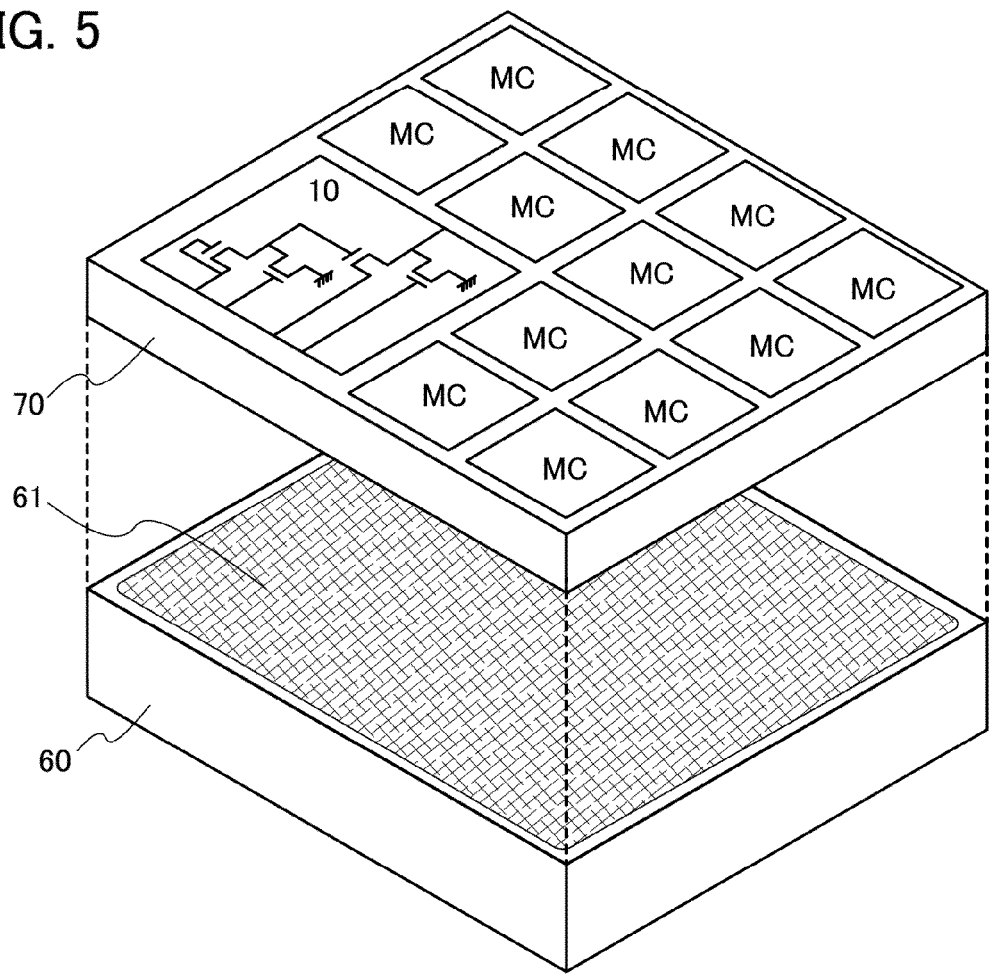
FIG. 5 illustrates a structural example of a semiconductor device.

FIG. 5 illustrates a structural example of the above semiconductor device. The semiconductor device illustrated in FIG. 5 includes a single crystal silicon substrate 60 and a layer 70. The single crystal silicon substrate 60 has a layer 61 including the flip-flop and the like. The layer 70 has the memory cell (MC) and the power supply control circuit 10 provided to overlap with the layer 61. Note that it is possible to form the memory cell on the same layer as the power supply control circuit 10 when the memory cell is the memory cell illustrated in FIG. 4B or the memory cell in FIG. 4C, which includes a transistor whose channel is formed in the oxide semiconductor layer, is used.

In addition, the flip-flop is electrically connected to the power supply control circuit 10 and the memory cell (MC) through an opening provided in the layer 70. It is preferable that the layer 61 including the flip-flop or the like overlaps with the power supply control circuit 10 and the memory cell (MC), all of which are included in an integrated circuit, as illustrated in FIG. 5. This is because the circuit area can be reduced.

It is to be noted that the integration circuit disclosed in this specification does not necessarily have the structure illustrated in FIG. 5. Although FIG. 5 illustrates an integrated circuit including the single crystal silicon substrate 60 as an example, the single crystal silicon substrate 60 can be replaced with a substrate (what is called an SOI substrate) where a single crystal silicon layer is provided over an insulating surface.

This application is based on Japanese Patent Application serial no. 2011-091577 filed with the Japan Patent Office on Apr. 15, 2011, and Japanese Patent Application serial no. 2011-108882 filed with the Japan Patent Office on May 14, 2011, the entire contents of which are hereby incorporated by reference.

What is claimed is:

1. A semiconductor device comprising:
a power supply control circuit comprising a first transistor, a second transistor, a third transistor, and a fourth transistor; and
a signal processing circuit comprising an input terminal and an output terminal,
wherein a gate of the first transistor is electrically connected to one of a source and a drain of the first transistor,
wherein the other of the source and the drain of the first transistor is electrically connected to a gate of the second transistor and one of a source and a drain of the third transistor,
wherein one of a source and a drain of the second transistor is electrically connected to one of a source and a drain of the fourth transistor and the input terminal,
wherein the other of the source and the drain of the second transistor is electrically connected to a first wiring,
wherein a gate of the third transistor is electrically connected to a gate of the fourth transistor and the output terminal,
wherein the other of the source and the drain of the third transistor and the other of the source and the drain of the fourth transistor is electrically connected to a second wiring, and
wherein at least one of the second transistor and the fourth transistor comprises a channel included in an oxide semiconductor layer.

2. The semiconductor device according to claim 1, wherein the power supply control circuit further comprises a buffer provided between the gate of the fourth transistor and the output terminal.

3. The semiconductor device according to claim 2, wherein an output terminal of the buffer is electrically connected only to the gate of the fourth transistor.

4. The semiconductor device according to claim 1, wherein at least one of the first transistor and the third transistor comprises an oxide semiconductor layer.

5. The semiconductor device according to claim 4, wherein at least one of the oxide semiconductor layer in the first transistor, the second transistor, the third transistor, and the fourth transistor includes a CAAC.

6. The semiconductor device according to claim 1, wherein the signal processing circuit includes a flip-flop and a memory cell configured to transmit data to and receive data from the flip-flop,
wherein the memory cell includes a memory transistor whose channel is included in an oxide semiconductor layer, and
wherein the memory cell is configured to hold the data at a node which is in a floating state when the memory transistor is an off state.

7. The semiconductor device according to claim 6, wherein the flip-flop includes a transistor whose channel is formed in a silicon layer, and
wherein a first region including the power supply control circuit and the memory cell is overlapped with a second region including the flip-flop.

8. The semiconductor device according to claim 1, wherein a potential applied to the first wiring is higher than a potential applied to the second wiring.

9. A driving method of a semiconductor device comprising: a power supply control circuit including a first transistor, a second transistor, a third transistor, and a fourth transistor; and a signal processing circuit, the driving method comprising the steps of:
supplying a start signal to one of a source and a drain of the first transistor and a gate of the first transistor, whereby turning on the second transistor;
supplying a first potential to the signal processing circuit through a channel of the second transistor;
supplying an output signal to a gate of the third transistor and a gate of the fourth transistor, whereby turning on the third transistor and the fourth transistor; and
supplying a second potential to the signal processing circuit and the gate of the second transistor, whereby turning off the second transistor,
wherein the second potential is lower than the first potential and is a ground potential,
wherein at least one of the channel of the second transistor and a channel of the fourth transistor is included in an oxide semiconductor layer, and
wherein the step of supplying the output signal is performed after the step of supplying the first potential.

10. The driving method according to claim 9, wherein the power supply control circuit further comprises a buffer provided between the gate of the fourth transistor and an output terminal of the signal processing circuit.

11. The driving method according to claim 10, wherein an output terminal of the buffer is electrically connected only to the gate of the fourth transistor.

12. The driving method according to claim 9, wherein at least one of the first transistor and the third transistor comprises an oxide semiconductor layer.

13. The driving method according to claim 9, wherein the signal processing circuit includes a flip-flop and a memory cell configured to transmit data to and receive data from the flip-flop,
wherein the memory cell includes a memory transistor whose channel is included in an oxide semiconductor layer, and
wherein the memory cell is configured to hold the data at a node which is in a floating state when the memory transistor is an off state.

* * * * *

UNITED STATES PATENT AND TRADEMARK OFFICE
CERTIFICATE OF CORRECTION

| | | |
|---|---|---|
| PATENT NO. | : 9,070,776 B2 | Page 1 of 1 |
| APPLICATION NO. | : 13/442995 | |
| DATED | : June 30, 2015 | |
| INVENTOR(S) | : Hidetomo Kobayashi | |

It is certified that error appears in the above-identified patent and that said Letters Patent is hereby corrected as shown below:

In The Specification

Column 22, line 13, after "manner" insert --:--; and

In The Claims

Column 30, line 43, claim 12, replace "claim9" with --claim 9--.

Signed and Sealed this
Sixteenth Day of February, 2016

Michelle K. Lee
*Director of the United States Patent and Trademark Office*